(12) United States Patent
Schmidt et al.

(10) Patent No.: US 12,048,166 B2
(45) Date of Patent: Jul. 23, 2024

(54) HALL INTEGRATED CIRCUIT AND CORRESPONDING METHOD OF MANUFACTURING OF A HALL INTEGRATED CIRCUIT USING WAFER STACKING

(71) Applicant: LFOUNDRY S.R.L., Avezzano (IT)

(72) Inventors: Carsten Schmidt, Avezzano (IT);
Mario Blasini, Avezzano (IT);
Gerhard Spitzlsperger, Avezzano (IT);
Alessandro Montagna, Avezzano (IT)

(73) Assignee: LFOUNDRY S.R.L. (IT)

( * ) Notice: Subject to any disclaimer, the term of this patent is extended or adjusted under 35 U.S.C. 154(b) by 471 days.

(21) Appl. No.: 17/295,529

(22) PCT Filed: Nov. 21, 2019

(86) PCT No.: PCT/IB2019/060044
§ 371 (c)(1),
(2) Date: May 20, 2021

(87) PCT Pub. No.: WO2020/104998
PCT Pub. Date: May 28, 2020

(65) Prior Publication Data
US 2022/0020814 A1 Jan. 20, 2022

(30) Foreign Application Priority Data
Nov. 21, 2018 (EP) ..................... 18207662

(51) Int. Cl.
*H10B 61/00* (2023.01)
*G01R 33/07* (2006.01)
(Continued)

(52) U.S. Cl.
CPC ........... *H10B 61/00* (2023.02); *G01R 33/072* (2013.01); *G01R 33/077* (2013.01);
(Continued)

(58) Field of Classification Search
CPC ...... H10N 52/01; H10N 52/101; H10N 52/80; H10N 59/00; H10N 52/85; H10B 61/00;
(Continued)

(56) References Cited

U.S. PATENT DOCUMENTS

2006/0170406 A1 8/2006 Kawashima et al.
2009/0256559 A1 10/2009 Ausserlechner et al.
(Continued)

FOREIGN PATENT DOCUMENTS

DE 102009027338 A1 1/2011
WO WO2010/101815 A1 9/2010
(Continued)

OTHER PUBLICATIONS

PCT International Search Report and Written Opinion issued by the International Bureau for PCT Application No. PCT/IB2019/060044, dated Apr. 30, 2020, pp. 1-13.
(Continued)

*Primary Examiner* — Latanya N Crawford Eason
(74) *Attorney, Agent, or Firm* — The Belles Group, P.C.

(57) ABSTRACT

A Hall integrated circuit including a vertical Hall element, having a first wafer and a second wafer, the second wafer including a CMOS substrate integrating a CMOS processing circuit coupled to the vertical Hall element and a stack of dielectric layers, and the first wafer including a Hall-sensor layer having a first surface and a second surface, the first and second wafers being bonded with the interposition of a dielectric layer arranged above the first surface of the Hall-sensor layer. The vertical Hall element has: at least a first Hall terminal; at least a second Hall terminal; a deep trench isolation ring extending through the Hall-sensor layer from the first surface to the second surface and enclosing and isolating a Hall sensor region of the Hall-sensor layer; and a first and a second conductive structures electrically con-
(Continued)

nected to respective contact pads embedded in the stack of the second wafer.

13 Claims, 30 Drawing Sheets

(51) Int. Cl.
| | | |
|---|---|---|
| *H01L 21/768* | (2006.01) | |
| *H01L 23/48* | (2006.01) | |
| *H01L 25/065* | (2023.01) | |
| *H10N 52/00* | (2023.01) | |
| *H10N 52/01* | (2023.01) | |
| *H10N 52/80* | (2023.01) | |
| *H10N 59/00* | (2023.01) | |

(52) U.S. Cl.
CPC .. *H01L 21/76877* (2013.01); *H01L 21/76898* (2013.01); *H01L 23/481* (2013.01); *H01L 25/0657* (2013.01); *H10N 52/01* (2023.02); *H10N 52/101* (2023.02); *H10N 52/80* (2023.02); *H10N 59/00* (2023.02)

(58) Field of Classification Search
CPC .. G01R 33/072; G01R 33/075; G01R 33/077; H01L 21/76898; H01L 23/481; H01L 25/0657
See application file for complete search history.

(56) References Cited

U.S. PATENT DOCUMENTS

| | | |
|---|---|---|
| 2014/0347045 A1 | 11/2014 | Paul et al. |
| 2017/0225945 A1* | 8/2017 | Cok ............. B81C 1/00373 |

FOREIGN PATENT DOCUMENTS

| | | |
|---|---|---|
| WO | WO2011/000601 A1 | 1/2011 |
| WO | WO2019/219941 A1 | 11/2019 |

OTHER PUBLICATIONS

Sander, Christian, et al., "Monolithic Isotropic 3D Silicon Hall Sensor," Sensors and Actuators A: Physical, Elsevier BV, NL, vol. 247, Jun. 27, 2016, pp. 587-597, XP029713790, ISSN: 0924-4247, DOI: 10.1016/J.SNA.2016.06.038 Section 3.; figures 3,4.

Popovic, R. S., "Hall Effect Devices," Institute of Physics Publishing, Series In Sensors, Bristol and Philadelphia 2004, Second Edition, pp. 1-426.

* cited by examiner

HALL INTEGRATED CIRCUIT AND CORRESPONDING METHOD OF MANUFACTURING OF A HALL INTEGRATED CIRCUIT USING WAFER STACKING

CROSS-REFERENCE TO RELATED APPLICATIONS

This patent application is a U.S. national stage application under 35 U.S.C. § 371 of PCT Application No. PCT/162019/060044, filed Nov. 21, 2019, which claims priority from European Patent Application No. 18207662.0, filed Nov. 21, 2018. The entire disclosure of the aforementioned priority applications are incorporated herein by reference in their entireties.

TECHNICAL FIELD

The present invention relates to a Hall integrated circuit (IC) and to a corresponding method of manufacturing of a Hall integrated circuit using wafer stacking.

BACKGROUND ART

The principle of operation and basic technology of Hall devices are described in the book by R. S. Popovic, entitled "Hall Effect Devices", Institute of Physics Publishing, Bristol and Philadelphia 2004.

US 2014/0347045 specifies an isotropic three-dimensional Hall sensor with at least three electrode pairs wherein each electrode pair comprises a terminal on the front side and a terminal on the backside of a wafer. The three electrode pairs can be arranged such their directions through the wafer represent an orthogonal coordinate system. In addition, the Hall sensor region can be bounded laterally by deep trenches etched from both sides into the substrate. The electrical connections can be carried out by flip-chip or wire bonding.

US 2006/0170406 specifies a vertical Hall element with three electrodes formed in a row on the primary surface of the substrate and one buried electrode established by an epi process. The three electrodes on the primary surface are surrounded by dielectric layers of predetermined depths by which current passage regions are defined. The buried electrode is electrically connected by a doped hook-up structure.

WO 2010/101815 specifies a vertical Hall sensor with three electrodes formed in a well along a first axis. A fourth, buried electrode coupled to the well is formed by a deep diffusion region located below the well. The buried electrode is electrically connected by a doped hook-up structure.

WO 2011/000601 specifies a vertical Hall sensor with a primary surface of the substrate, a Hall sensor region in contact with the primary surface and a buried conductive region in contact with the Hall sensor region. A vertical Hall sensor is disclosed having four electrodes on the primary surface and four buried electrodes. The buried electrodes are electrically connected by doped hook-up structures.

US 2009/0256559 discloses a vertical Hall device which is formed on a substrate of first conductivity type having an epi layer of second conductivity type and buried conductive layer in between with second conductivity type. The vertical Hall device has four terminals. One terminal is connected to the conductive buried layer by a hook-up structure. There is an isolation structure between the hook-up structure and the other terminals.

Magnetic sensor ICs typically use silicon-based Hall elements which are monolithically integrated with the electrical circuits required for signal conditioning and amplification. Typical commercial products with monolithically integrated Hall elements are Hall switch ICs, Hall ICs for linear position measurement, direct angle sensor Hall ICs, Hall ICs for current sensing and 3D Hall sensor ICs. Depending on the product type, a Hall IC may include horizontal Hall elements, vertical Hall elements, or both. Vertical Hall elements, which sense the strength of the magnetic field in a direction lying in the plane of the silicon surface, are used particularly in direct angle sensor Hall ICs and in 3D Hall sensor ICs.

Conventional vertical Hall elements are formed as follows: A well having n-type conductivity is formed in the low-doped silicon substrate of p-type conductivity. The n-type well constitutes the Hall plate of the sensor being isolated from the substrate by a p-n junction. Then three, four, five or more Hall terminals are formed on the silicon surface within the region of the n-type well, typically arranged in a row or on a circle (R. S. Popovic, "Hall Effect Devices", Institute of Physics Publishing, Bristol and Philadelphia 2004).

In these conventional vertical Hall elements, the sensitivity is limited by the finite depth of the n-type well in which the Hall terminals are placed. This is because only the vertical component of the operating current contributes to a Hall voltage measured between two sense terminals. For this reason, oftentimes high-voltage CMOS processes having deep wells are used for manufacturing Hall ICs with vertical Hall elements. Even in these processes, well depths are generally only in the order of several micrometers.

Besides low sensitivity, conventional vertical Hall elements typically suffer from high residual offsets. The offset of a Hall element, i.e. the Hall voltage measured at zero magnetic field strength, can be reduced by known techniques such as current spinning, orthogonal coupling of several Hall elements, or a combination thereof. Effective offset reduction relies on commutation of Hall terminals and on the four-fold symmetry of the Hall device. Single conventional vertical Hall elements having their terminals placed all on the same silicon surface deviate necessarily from an ideal four-fold symmetry.

Hence, there is a need for vertical Hall elements having improved sensitivity and lower levels of residual offset that can be integrated in the Hall IC together with the electrical circuits required for signal conditioning and amplification.

There is moreover a need for a novel method of integrating Hall elements with improved characteristics with the electrical circuits on the Hall IC required for signal conditioning and amplification.

There is finally a need for direct angle sensor Hall ICs and 3D Hall sensor ICs having a higher accuracy.

DISCLOSURE OF INVENTION

The object of the present invention is to satisfy the aforementioned need.

According to the present invention, a Hall integrated circuit (IC) and a corresponding method of manufacturing are thus provided, as defined in the appended claims.

BRIEF DESCRIPTION OF THE DRAWINGS

For a better understanding of the present invention, preferred embodiments are described below, purely by way of non-limiting examples, with reference to the attached drawings, wherein.

DETAILED DESCRIPTION

As will be discussed in detail, according to an embodiment of the present solution, a first wafer is provided, with an epitaxial semiconductor layer having a thickness for example in the range of 10 micrometers to 30 micrometers and having low doping of n-type conductivity. A first plurality of Hall terminals is formed on the first surface of the epitaxial semiconductor layer together with the corresponding wiring. Provided is a second wafer which is a silicon wafer having the typical dopant concentration and conductivity type used in CMOS manufacturing. Integrated circuits for signal conditioning and amplification of the Hall element are formed on first surface of the second wafer using standard CMOS manufacturing techniques. The first wafer is flipped and attached with its first surface onto the first surface of the second wafer, achieving a permanent wafer-to-wafer bonding. The stacked wafer is thinned from the second surface of the first wafer until only the low-doped semiconductor epitaxial layer with n-type conductivity remains. A second plurality of Hall terminals with corresponding wiring is formed on the thinned second surface of the first wafer applying identical design rules and process conditions as for the first set of Hall terminals. Hall terminals of the first plurality and Hall terminals of the second set are arranged on each surface such that the finished Hall element has four-fold symmetry. A deep trench isolation ring is formed extending through the entire epitaxial silicon layer and enclosing the first plurality of Hall terminals as well as the second plurality of Hall terminals. Electrical connections are provided such that each Hall terminal of the first plurality of Hall terminals and each Hall terminal of the second plurality of Hall terminals is individually connected to the wiring on the second wafer.

Figure 1:
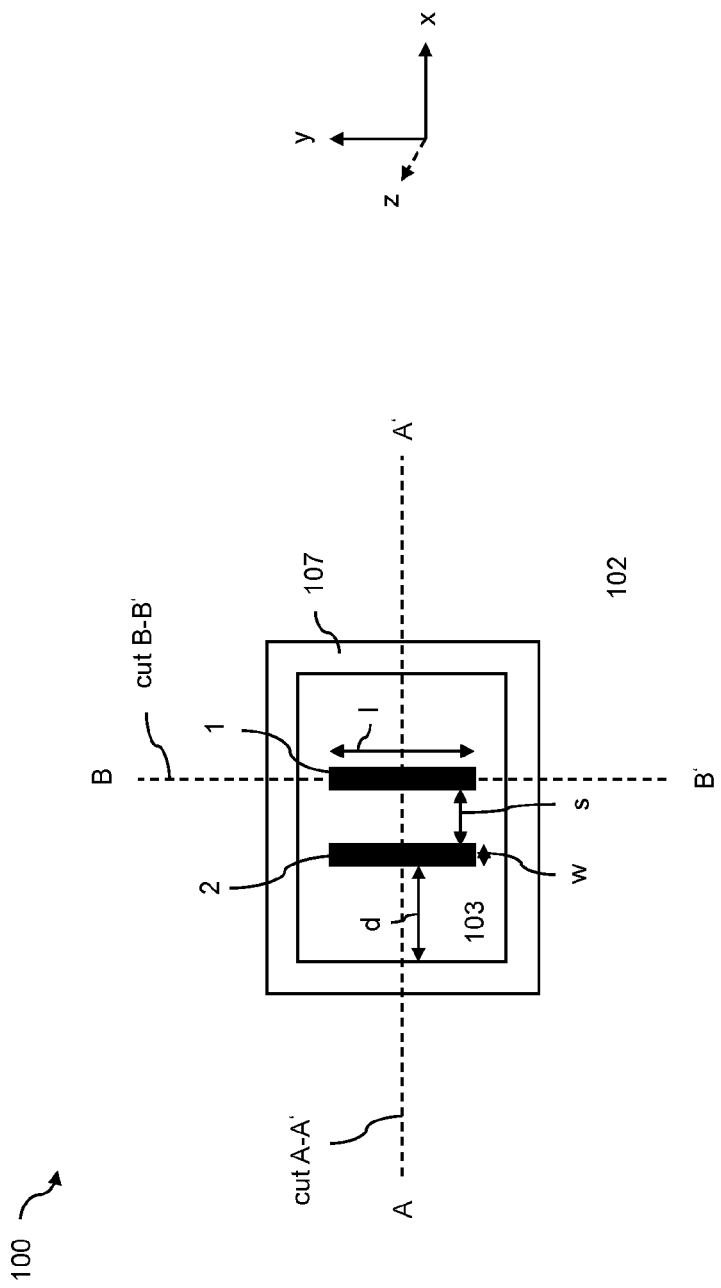
FIG. 1 is a schematic top plan view of a portion of a Hall integrated circuit, according to an embodiment of the present solution.
Figure 2:
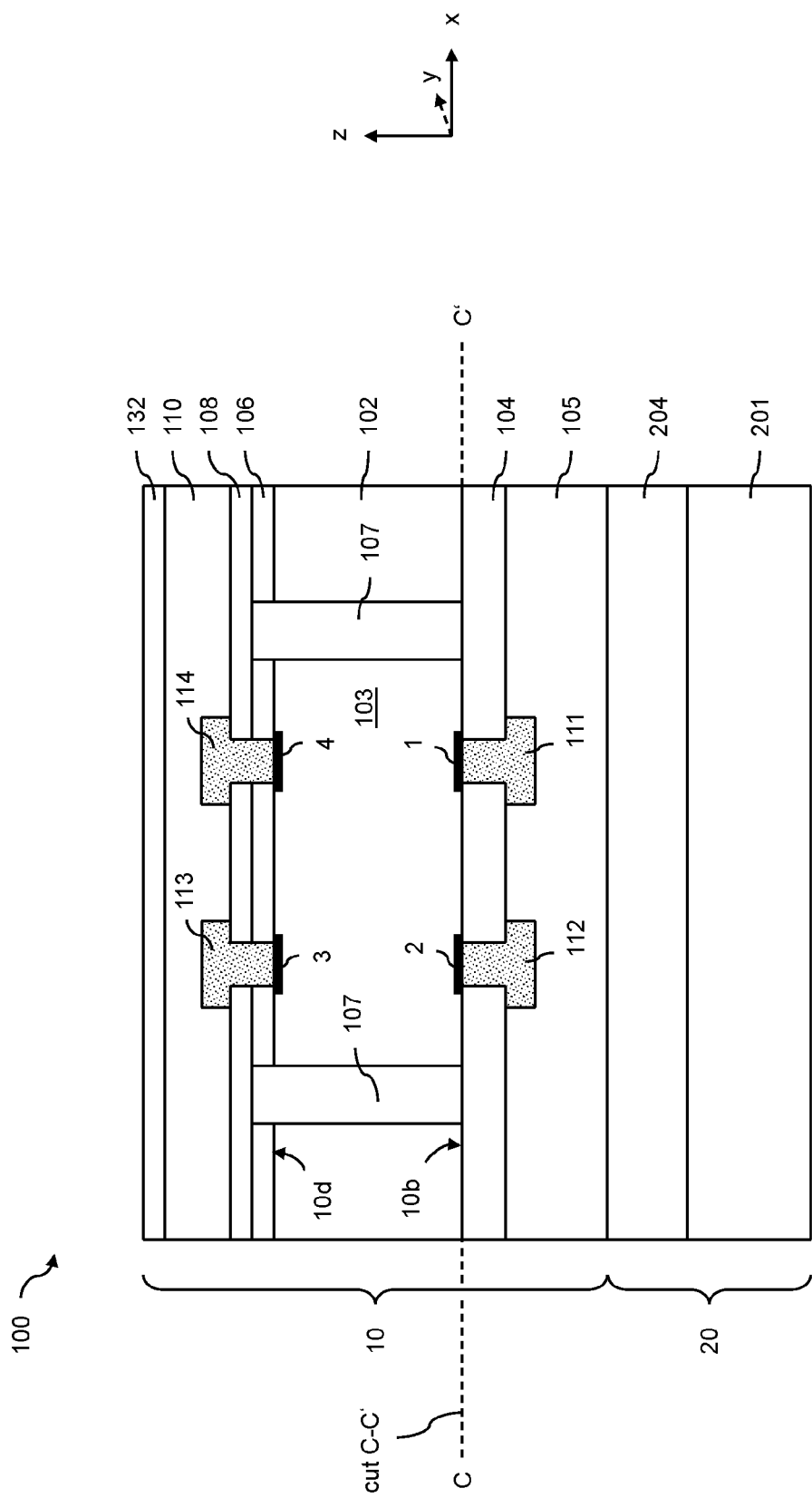
FIGS. 2 and 3 are schematic cross-sections of the Hall integrated circuit of FIG. 1, taken along lines A-A' and B-B' of FIG. 1.
Figure 3:
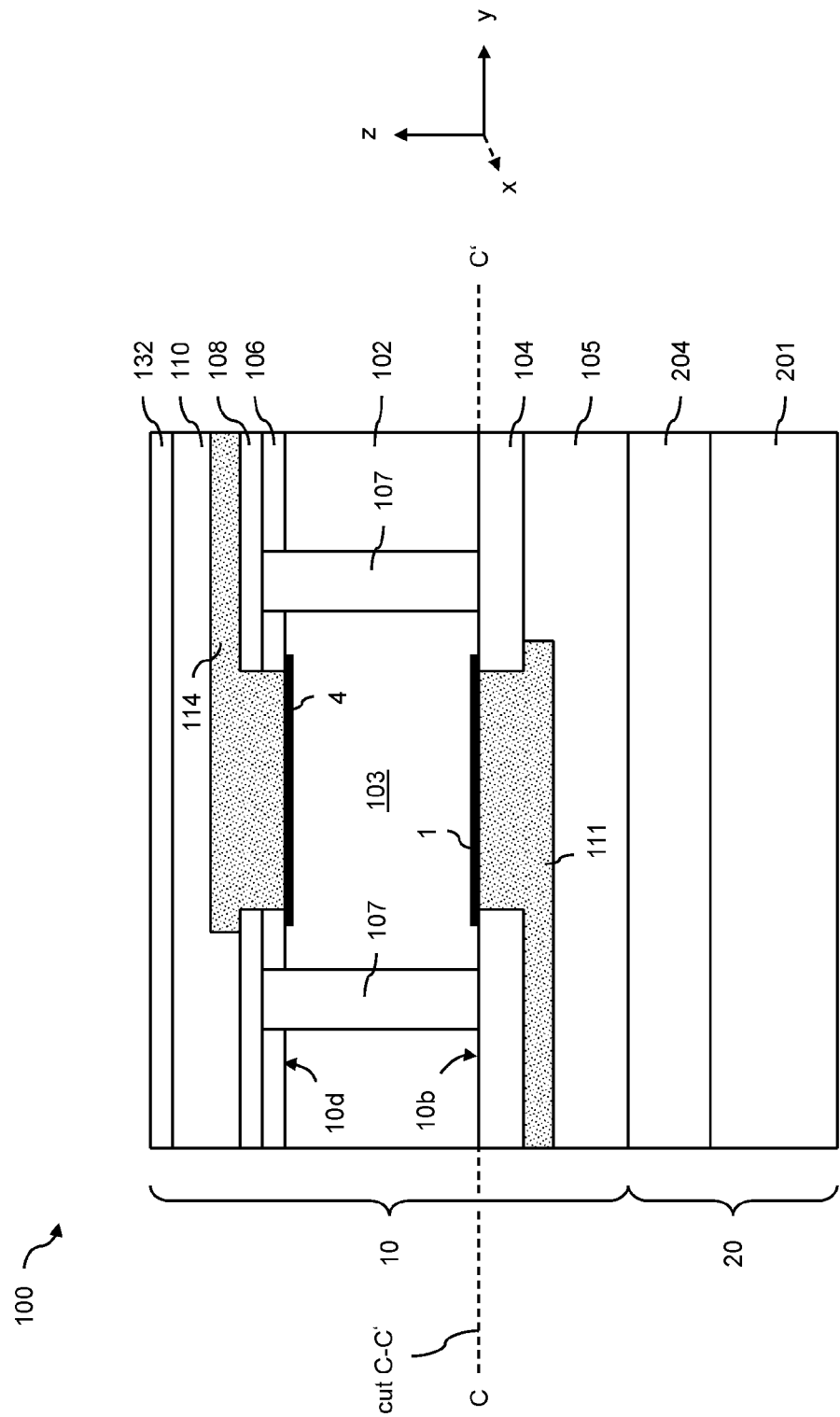

FIG. 1, FIG. 2 and FIG. 3 show the vertical Hall element 100 of an integrated Hall IC product. FIG. 1 shows the vertical Hall element 100 in the x-y-plane along the cut direction C-C' as indicated in FIG. 2 and FIG. 3. In FIG. 1 two further cut directions are indicated, the cut direction A-A' along the x-axis and the cut direction B-B' along the y-direction. FIG. 2 is a cross-sectional diagram displaying the vertical Hall element 100 in the x-z-plane along cut direction A-A'. FIG. 3 shows the same Hall element in the y-z-plane along the cut direction B-B' as indicated in FIG. 1. The vertical Hall element 100 is formed on a first wafer 10, which is attached to second wafer 20, the latter comprising the integrated circuits for signal conditioning and amplification. A substrate 201 of the second wafer might be a low-doped silicon substrate having p-type conductivity; but is not limited to this. In general, any substrate that is suitable for manufacturing of CMOS devices and circuits could be selected. The CMOS devices and circuits which are formed on the substrate 201 of the second wafer 20 are not shown in FIG. 2 and FIG. 3. 204 denotes the stack of dielectric layers formed on the substrate 201, in which the metal wirings of the circuits are embedded (according to standard CMOS processing techniques). The vertical Hall element of the Hall IC is formed on a substrate 102 of the first wafer 10. The substrate 102 might be a low-doped epitaxial silicon layer having n-type conductivity. The resistivity of the epitaxial silicon layer 102 is chosen such that vertical Hall element 100 has optimum characteristics, for example a high magnetic field sensitivity. The substrate 102 could be also a germanium substrate, a gallium arsenide (GaAs) substrate, a indium arsenide (InAs) substrate, an indium antimonide (InSb) substrate, or a substrate of a different material having optimal characteristics for the Hall element such as a high mobility. For reasons of clarity, it is assumed in the following that the substrate 102 is a low-doped epitaxial silicon layer having n-type conductivity (the reason for choosing n-type doping for silicon is the higher mobility, which translates into higher sensitivities values for the Hall sensor). Two shallow and highly doped regions 1 and 2 are formed having n-type conductivity and extending to a first surface 10b of the epitaxial silicon layer 102. As shown in FIG. 1, the two highly doped regions 1 and 2 have a rectangular shape in the x-y plane, however, other shapes could be considered as well. The two highly doped regions 1 and 2 have a same width w and same length l. The distance between the two highly doped regions 1 and 2 is denoted by s. An oxide layer 104 is disposed on the first surface 10b having two openings, one located within the region of the highly doped region 1 and one located within the region of the highly doped region 2. In FIG. 2 and FIG. 3, 111 denotes a metal structure which comprises the metal filling of the opening in contact with the highly doped region 1 and a metal wire disposed on the oxide layer 104, which is in contact with said metal filling. Likewise, 112 denotes a metal structure which comprises the metal filling of the opening in contact with the highly doped region 2 and a metal wire disposed on the oxide layer 104 being in contact with said metal filling. As can be seen on FIG. 3, the wiring part of metal structure 111 extends in y-direction to the left side. Same is true also for the metal structure 112. An oxide layer 105 is disposed on the metal structures 111 and 112, as well as on the oxide layer 104, so that the wiring part of the metal structure 111 and the wiring part of the metal structure 112 are vertically embedded in oxide. The oxide layer 105 is planarized. With the planarized oxide surface the wafer 10 is attached and permanently bonded to the planarized oxide surface of layer 204 of wafer 20. Using the wafer 20 as carrier the wafer 10 has been thinned from backside such that only the epitaxial silicon layer 102 remains. The thickness of the epitaxial silicon remaining after the thinning is denoted by T3 (see FIG. 5) and might be in the range of 10 micrometers to 30 micrometers, however, smaller or larger thickness values could be considered as well. In FIG. 2 and FIG. 3 the second surface of the epitaxial layer resulting after the thinning is denoted by 10d. 10b and 10d are two opposing surfaces of the epitaxial silicon layer 102, lying in the x-y-plane parallel to each other. Two shallow and highly doped regions 3 and 4 are formed having n-type conductivity and extending to the second surface 10d of the epitaxial silicon layer 102. The two highly doped regions 3 and 4 have the same width w and same length l as their counterparts 1 and 2. Also the two highly doped regions 3 and 4 are separated by the same distance s, by which the highly doped regions 1 and 2 are separated from each other. Moreover, the highly doped region 3 is located directly above the highly doped region 2 in the sense that a straight line connecting the center of region 3 and the center of region 2 would be perpendicular to the epitaxial silicon surfaces 10*b* and 10*d*. Equally, the highly doped region 4 is located directly above the highly doped region 1 in the sense that a straight line connecting the center of region 4 and the center of region 1 would be perpendicular to the epitaxial silicon surfaces 10*b* and 10*d*. An oxide layer 106 is disposed on the second surface 10*d* of the epitaxial silicon layer and a silicon nitride layer 108 is disposed thereon. A deep trench isolation ring 107 is formed which extends from the second surface 10*d* to the first surface 10*b*. An inner surface of the deep trench isolation is perpendicular to the two surfaces 10*b* and 10*d* of the epitaxial silicon layer. As is seen in FIG. 1, the deep trench isolation ring 107 encloses the highly doped regions 1 and 2, which extend to the first surface 10*b*. In x-direction, the distance between the deep trench isolation ring 107 and the highly doped region 2 is denoted with d. The distance between the deep trench isolation ring 107 and highly doped region 1 in x-direction has the same value d. The epitaxial silicon volume enclosed by the deep trench isolation ring 107 (being separated and isolated from the remaining portion of the epitaxial silicon layer 102, external thereto) constitutes the Hall sensor region or Hall plate of the finished vertical Hall element 100 and is denoted by 103. The combined stack of layer 106 and 108 has two openings, one located within the highly doped region 3 and one located within the highly doped region 4. Like on the first surface 10*b*, two metal structures 113 and 114 are formed. The metal structure 113 comprises the metal filling of the opening in contact with region 3 and a metal wiring disposed on the silicon nitride layer 108, the metal wiring being connected to said metal filling. Likewise, the metal structure 114 comprises the metal filling of the opening in contact with region 4 and a metal wiring disposed on the silicon nitride layer 108, the metal wiring being in contact with said metal filling. As shown in FIG. 3, the wiring part of metal structure 114 extends laterally to right side (along y-direction). Same is true also for the metal structure 113. An oxide layer 110 is disposed on the metal structure 113 and 114 and on the silicon nitride layer 108. The wiring part of metal structures 113 and 114 are thus vertically embedded in dielectric material. For passivation of the finished Hall IC, a silicon nitride layer 132 is disposed on the oxide layer 110.

Figure 4:
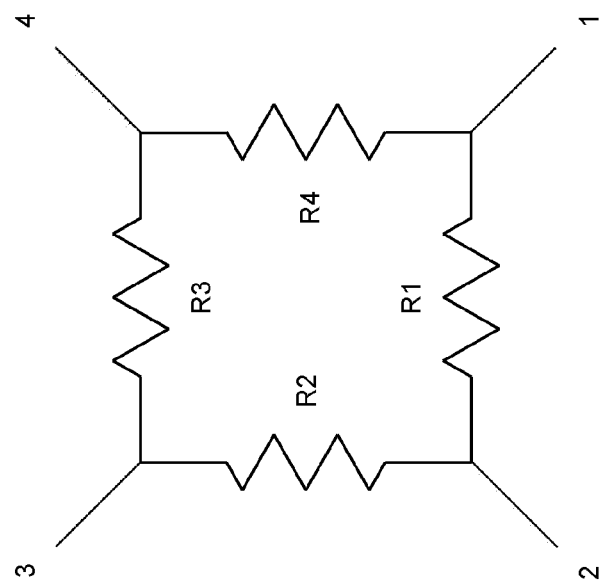
FIG. 4 shows the equivalent electrical representation of a Hall element of the Hall integrated circuit of FIG. 1.
Figure 5:
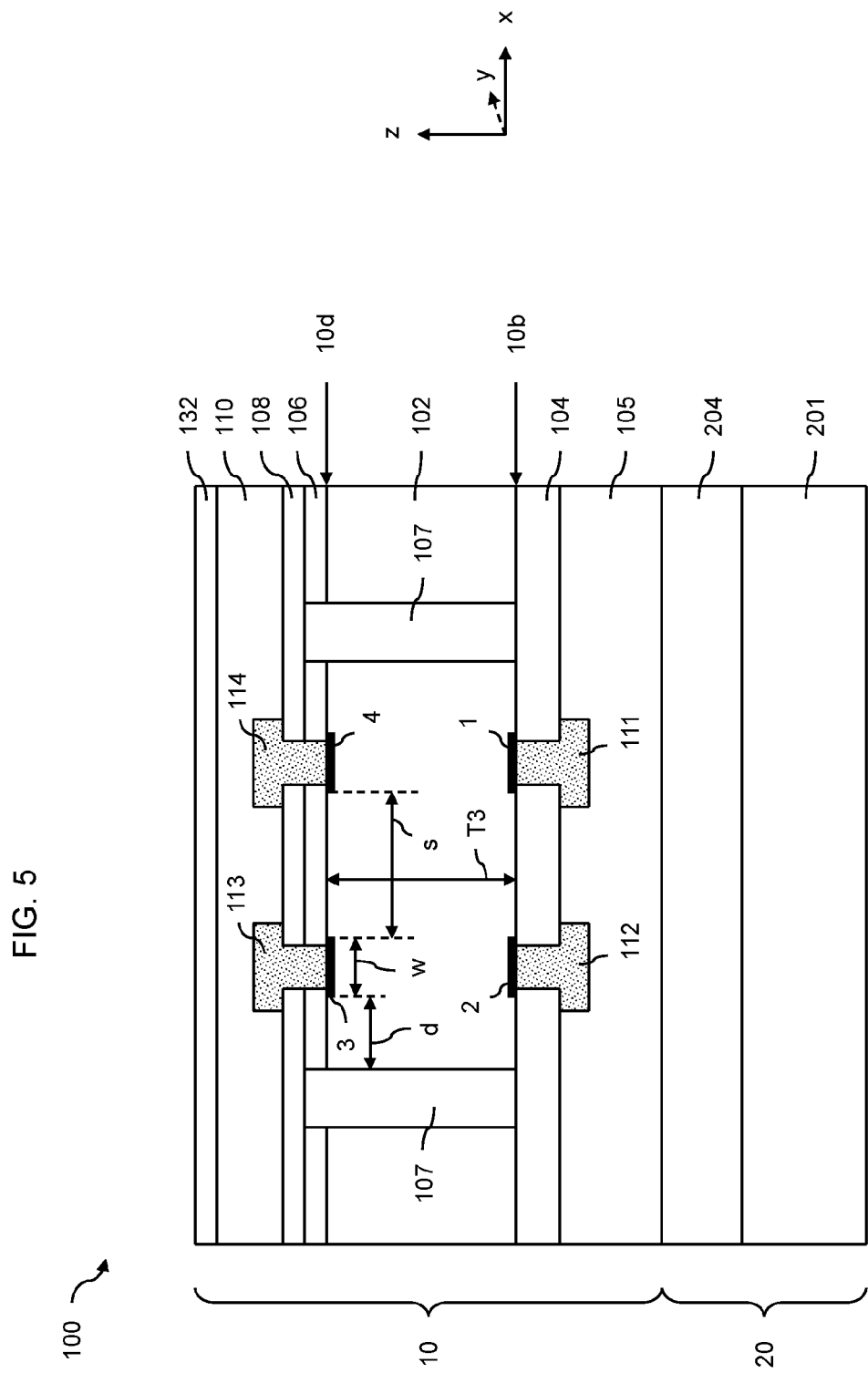
FIGS. 5 and 6 are schematic cross-sections equivalent to that of FIG. 2, with geometrical and electrical properties highlighted.

The vertical Hall element depicted in FIG. 1, FIG. 2 and FIG. 3 has four Hall terminals. Each Hall terminal is associated with one of the four highly doped regions 1, 2, 3 and 4 formed in the epitaxial silicon layer 102. In the following, the Hall terminals are denoted by the same number as their associated highly doped regions. A Hall element having four terminals can be represented by an equivalent circuit as shown in FIG. 4. The four terminals 1, 2, 3 and 4 are connected via four resistances R1, R2, R3 and R4 (in a Wheatstone bridge). As is known in the art, an effective offset cancellation can be achieved, if the four resistances R1, R2, R3 and R4 have the same or nearly same value. As is obvious by a person skilled in the art, for a vertical Hall element as shown in FIG. 5, the epitaxial silicon thickness T3, the width of the Hall terminals w, their lateral spacing s and the distance d to the deep trench isolation can be set such that the four resistances R1, R2, R3 and R4 are equal or nearly equal. In other words, the vertical Hall element has a four-fold symmetry or a nearly four-fold symmetry with respect to the four terminals (which may thus have corresponding geometrical and electrical properties). In this context it is noted that the doping concentration of the Hall sensor region 103 can be assumed to be homogeneous, since the doping is defined by the epitaxial growth of the layer 102. Moreover, the inner surfaces of the deep trench isolations are perpendicular to the first and second surface of the epitaxial silicon layer.

Figure 6:
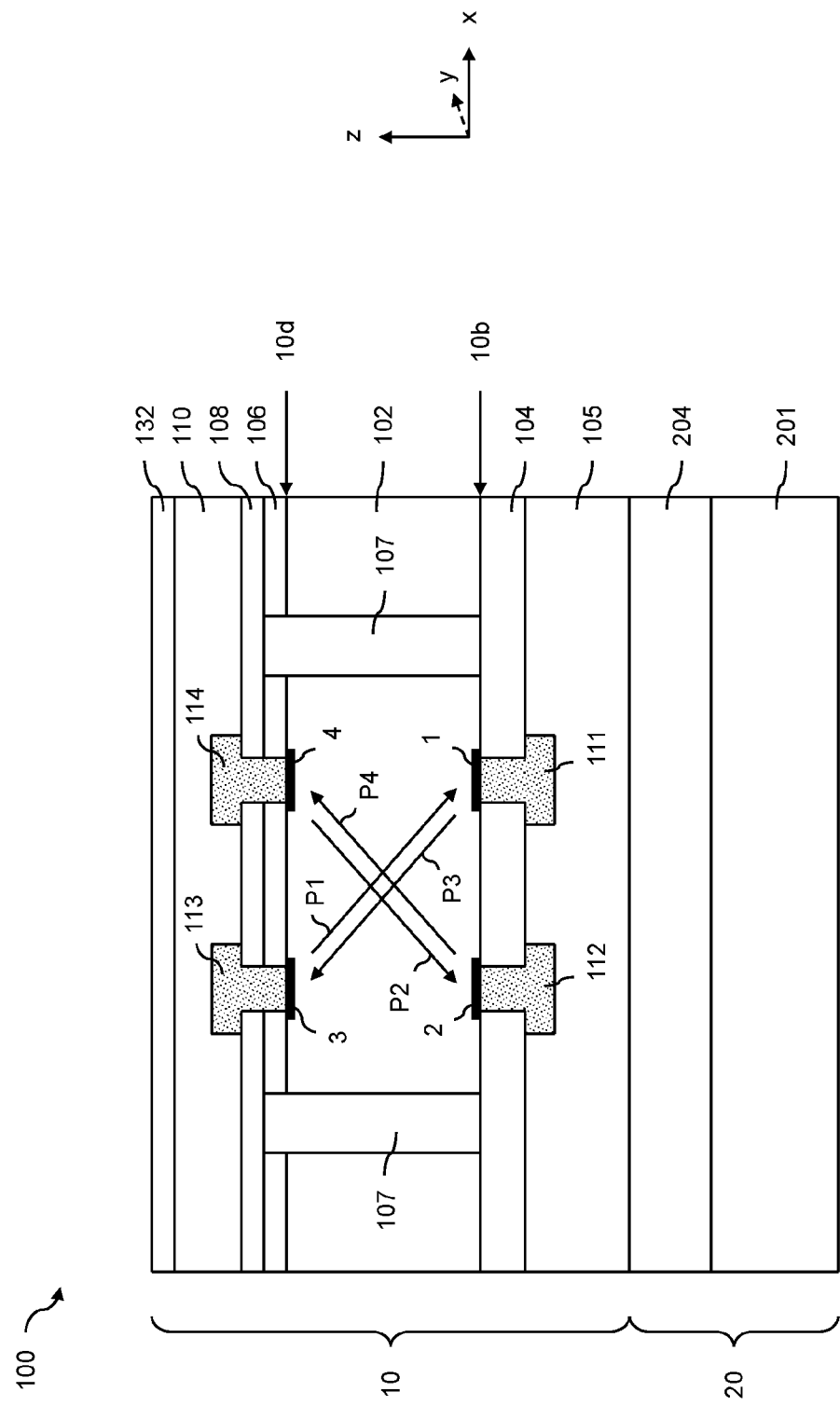

In the cross-sectional diagram of FIG. 6, the four different phases of operation are shown by the indicated current directions. In a first phase, denoted by P1, an operating current flows between the Hall terminals 3 and 1, and a Hall voltage is measured between the Hall terminals 4 and 2. In a second phase, denoted by P2, an operating current flows between the Hall terminals 4 and 2, and a Hall voltage is measured between the Hall terminals 1 and 3. In a third phase, denoted by P3, an operating current flows between the Hall terminals 2 and 4, and a Hall voltage is measured between the Hall terminals 3 and 1. Finally, in a fourth phase, denoted by P4, an operating current flows between the Hall terminals 2 and 4, and a Hall voltage is measured between the Hall terminals 3 and 1. In each phase, the vertical Hall element is sensitive to a magnetic field that is oriented in y-direction. In every phase, the current direction is perpendicular or nearly perpendicular to a straight line connecting the two Hall terminals, between the Hall voltage is measured. This geometry allows high values of sensitivity to be obtained. Short-circuits effects, typically reducing the sensitivity in conventional vertical Hall elements, are minimized in the vertical Hall element 100. A large sensitivity for the vertical Hall element 100 can further be obtained, since the thickness T3 can be selected to be large, particularly, it can be selected far larger than the depth of the Hall plate of a conventional vertical Hall element.

Figure 7:
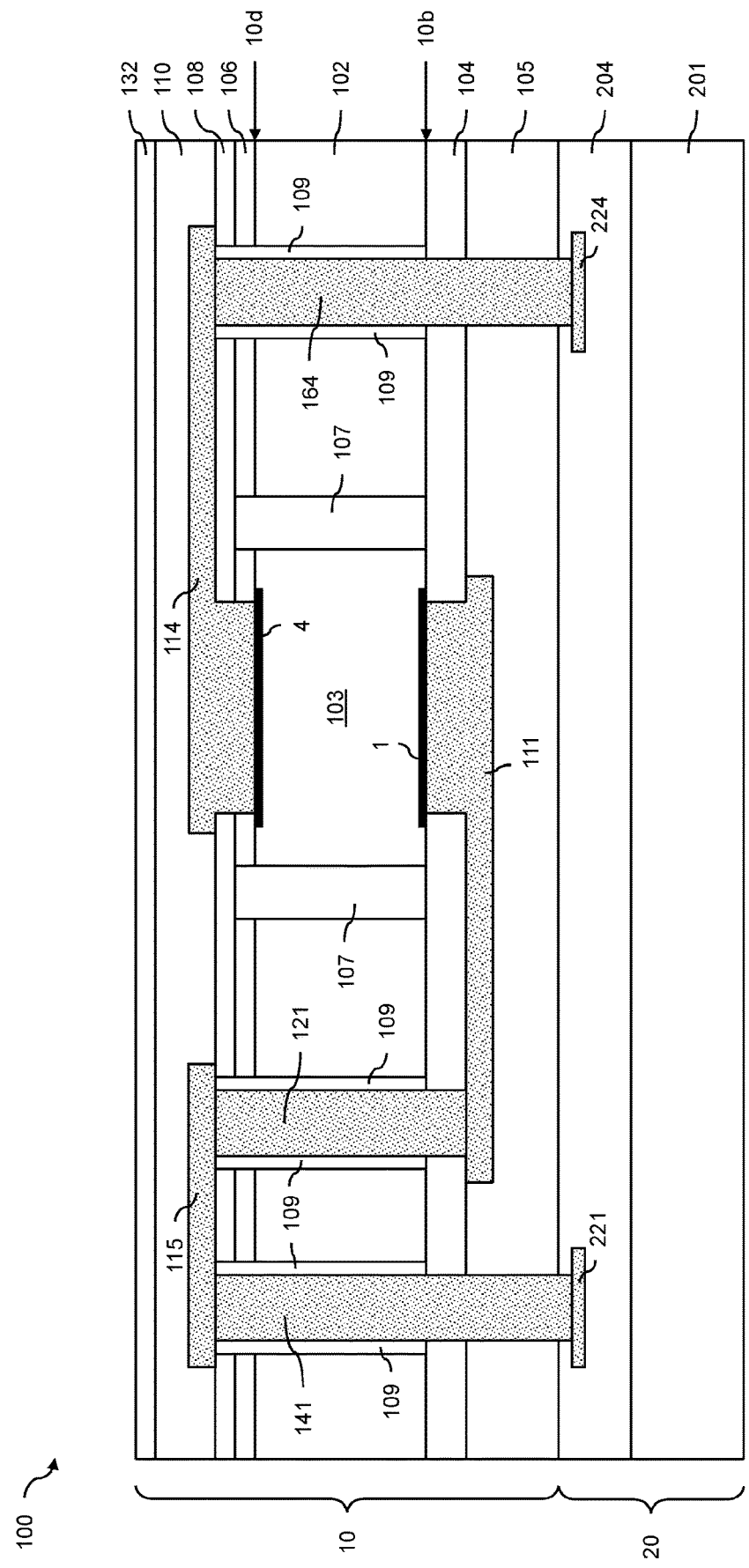
FIG. 7 is a schematic cross-section of the Hall integrated circuit according to a further aspect of the present solution.

In FIG. 1, FIG. 2 and FIG. 3 only the vertical Hall element 100 is shown without giving indication on how the four Hall terminals of the Hall element are connected to the integrated circuits formed on the second wafer 20. FIG. 7 is another cross-sectional diagram of the vertical Hall element 100 in cut direction B-B' along the y-direction, which shows in addition to FIG. 3 also the connections of the Hall terminals 1 and 4 to the integrated circuit of the Hall IC. As shown in FIG. 7, the metal structure 111 in contact with Hall terminal 1 extends laterally to the left beyond the deep trench isolation 107. At the left end, the metal wire is formed as metal pad. A through silicon via 121 sitting on said metal pad provides an electrical connection between metal structure 111 to a metal bridge 115 formed above the second surface 10*d* of the epitaxial silicon layer. Particularly, the through silicon via 121 extends through the combined stack of dielectric layers 106 and 108, through the epitaxial silicon layer 102 and through the oxide layer 104. The through silicon via 121 is filled with conductive material, the conductive filling being dielectrically isolated by an oxide liner 109 from the surrounding substrate 102. The metal bridge 115 entirely covers the through silicon via 121, which with it is in electrical contact. The metal bridge 115 further laterally extends to the left and covers here a second through silicon via, denoted by 141. The silicon through via 141 provides an electrical connection between the metal bridge 115 and landing pad 221 being embedded in the intermetal oxide layers 204 disposed on the substrate 201 of wafer 20. Particularly, the through silicon via 141 extends through the combined stack of dielectric layers 106 and 108, through the epitaxial silicon layer 102, through the oxide layers 104 and 105, and through a portion of the oxide layer 204 disposed on the silicon substrate 201 of wafer 20. Same as the through silicon via 121, the through silicon via is filled with conductive material, the conductive filling being isolated from epitaxial silicon substrate 201 by the oxide liner 109. The landing pad 221 is connected to the wiring of the integrated circuits disposed on substrate 20. As a result, an electrical connection between Hall terminal 1 formed on the Hall device wafer 10 and the electrical circuits formed on the IC wafer 20 is established. As is shown further in FIG. 8, the metal structure 114 extends to the right beyond the deep trench isolation. It covers a further through silicon via 164 establishing an electrical contact to the conductive filling of the through silicon via. The through silicon via 164 extends through the combined stack of layer 106 and 108, through the entire epitaxial silicon layer 102, through the oxide layers 104 and 105, and through a portion of the intermetal oxide layers denoted by 204. The through silicon via 164 lands on a respective metal pad 224. In this way, an electrical connection between the Hall terminal 4 formed on the second surface 10d of the epitaxial silicon layer 102 and the wiring exiting on the IC wafer 20 is established.

Figure 8:
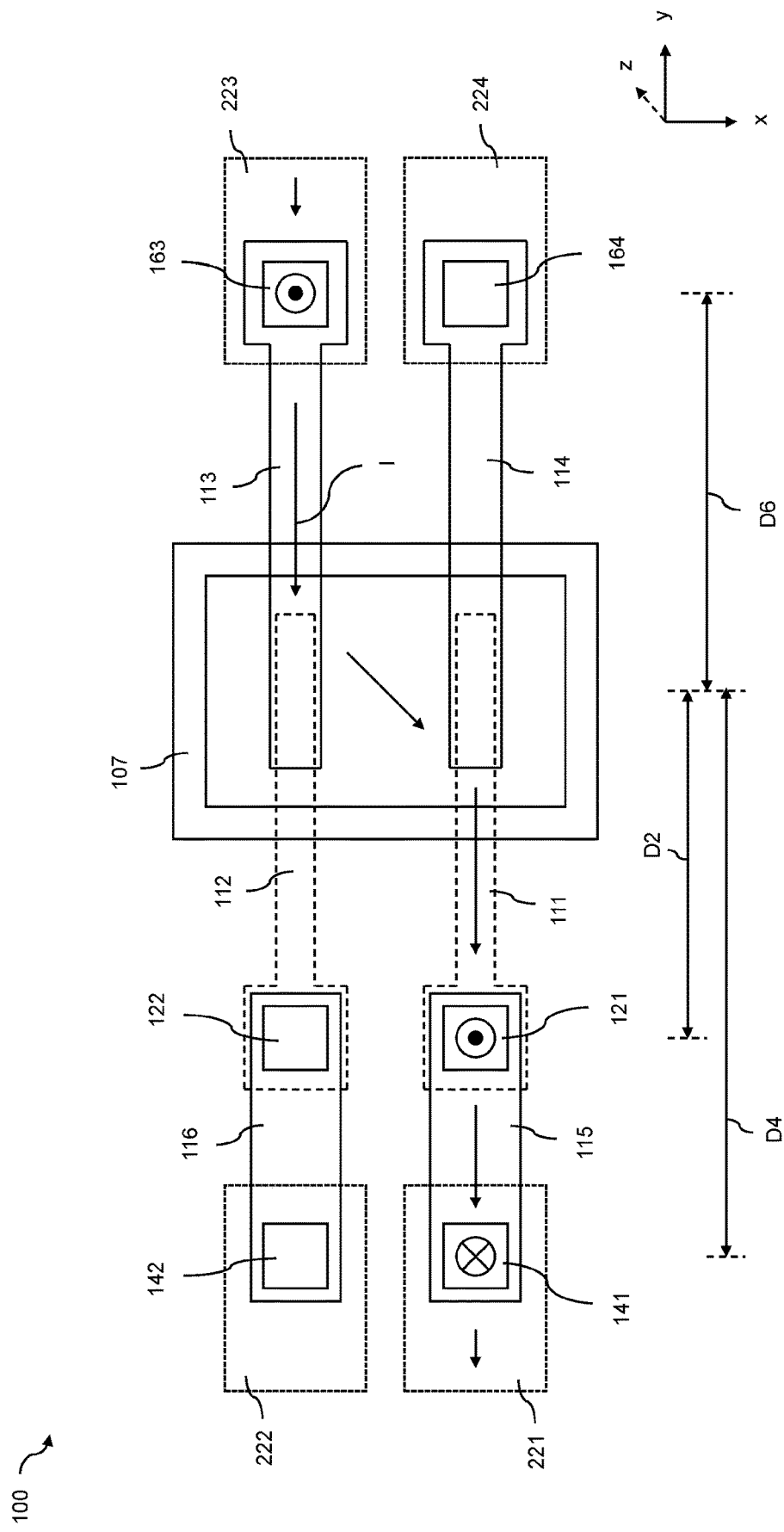
FIG. 8 is a schematic top plan view of the Hall integrated circuit of FIG. 7.

FIG. 8 is an aerial diagram showing the wiring and the vertical interconnections of the vertical Hall element 100 needed to access each of the four Hall terminals individually from the circuit wiring formed on wafer 20. Four metal pads denoted by 221, 222, 223 and 224 are embedded on the intermetal dielectric layer 204 of wafer 20 to provide access points to the four Hall terminals 1, 2, 3 and 4, respectively. The through silicon vias 141, 121, and 164, required to access the two Hall terminals 1 and 4, respectively, are arranged along a straight line parallel to the y-direction, which goes through the center of the Hall terminals 1 and 4. The distances of the through silicon vias to the Hall element are denoted by D4, D2, and D6 respectively. Similarly, the through silicon vias 142, 122 and 163, required to access the Hall terminals 2 and 3, respectively, are arranged along the straight line parallel to the y-direction, which goes through the center of the Hall terminals 2 and 3. The through silicon vias 142, 122 and 163 have the same distances D4, D2 and D6 to the Hall terminals as the through silicon vias 141, 121 and 164, respectively. Moreover, the wirings of the Hall terminals and the metal bridges are all oriented in y-direction.

In FIG. 8 the direction of the current flow through the wiring and vertical interconnections is indicated for first operation phase P1, in which a current is fed through the vertical Hall element from Hall terminal 3 to Hall terminal 1. As is obvious, the vertical current flow through the through silicon via 163 gives rise to an induced magnetic field, to which the vertical Hall element is sensitive. Similarly, the vertical current flow through the through silicon via 121 gives rise to an induced magnetic field, to which the vertical Hall element is sensitive. And similarly, the vertical current flow through the through silicon via 141 gives rise to an induced magnetic field, to which the vertical Hall element is sensitive. As the current direction is same in the through silicon vias 121 and 163, their induced magnetic fields cancel in tendency at the location of vertical Hall element 100. In general, the strengths of the induced magnetic fields at the vertical Hall element 100 depend on their distances D4, D2 and D6, respectively. Given the indicated current directions in the through silicon vias 141, 121 and 163, the distances D4, D2 and D6 can be set such that the parasitic magnetic field induced by the vertical current flow through the through silicon vias can be minimized at the location of the vertical Hall element. This holds true also for the other three operating phases of the vertical Hall element 100.

The fabrication of the stacked Hall sensor 100 is depicted in the FIGS. 9 to 30.

Figure 9:
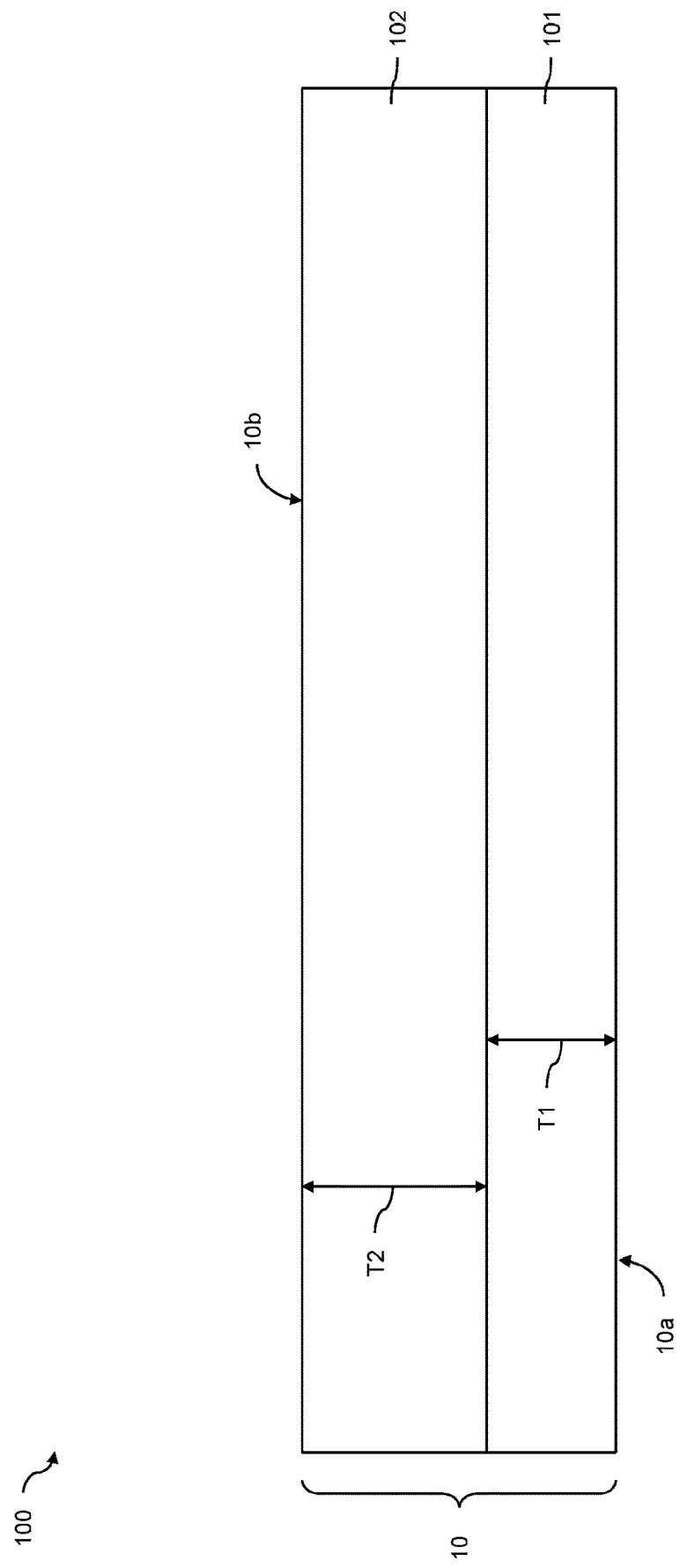
FIGS. 9-30 are schematic cross sections of the Hall integrated circuit of FIG. 7, in successive steps of a corresponding method of manufacturing.

As shown in FIG. 9 a wafer 10 is provided comprising a silicon substrate 101 and an epitaxial layer 102. The substrate 101 is preferably a highly doped silicon substrate having n-type conductivity. The thickness T1 of the silicon substrate depends on the wafer size and might be in the range of 600 micrometers to 800 micrometers. The epitaxial layer 102 is preferably a lightly doped silicon epitaxial layer having n-type conductivity as well. The thickness T2 of the epitaxial layer might be in the range of 10 micrometers to 30 micrometers, however, lower or higher values for the thickness T2 can be considered as well. The resistivity of the silicon epitaxial layer is chosen such that optimum Hall sensor characteristics are obtained for the finished device. As will be understood by a skilled person, the optimum resistivity of the silicon epitaxial layer 102 depends on the thickness and the size of the Hall plate. Typical resistivities might be in the range of 0.1 ohm-cm and 10 ohm-cm. Other semiconductor materials could be considered as well for the epitaxial layer 102. The starting material could also a silicon-on-insulator wafer (SOI). In this case, the epitaxial layer 102 is separated from the carrier substrate 101 by a buried oxide layer (BOX). For ease of discussion, the first surface of the wafer 10, which is defined by the low-doped epitaxial layer, is denoted 10b. The rear surface of the wafer 10 is denoted by 10a.

In a first fabrication step, alignment marks are created on the surface 10b. This is accomplished by conducting a photo-masked etch into the silicon as is known by a skilled person. The alignment marks printed in silicon are used to align subsequent photo layers performed on surface 10b of wafer 10. The alignment marks are not shown in FIG. 9.

Figure 10:
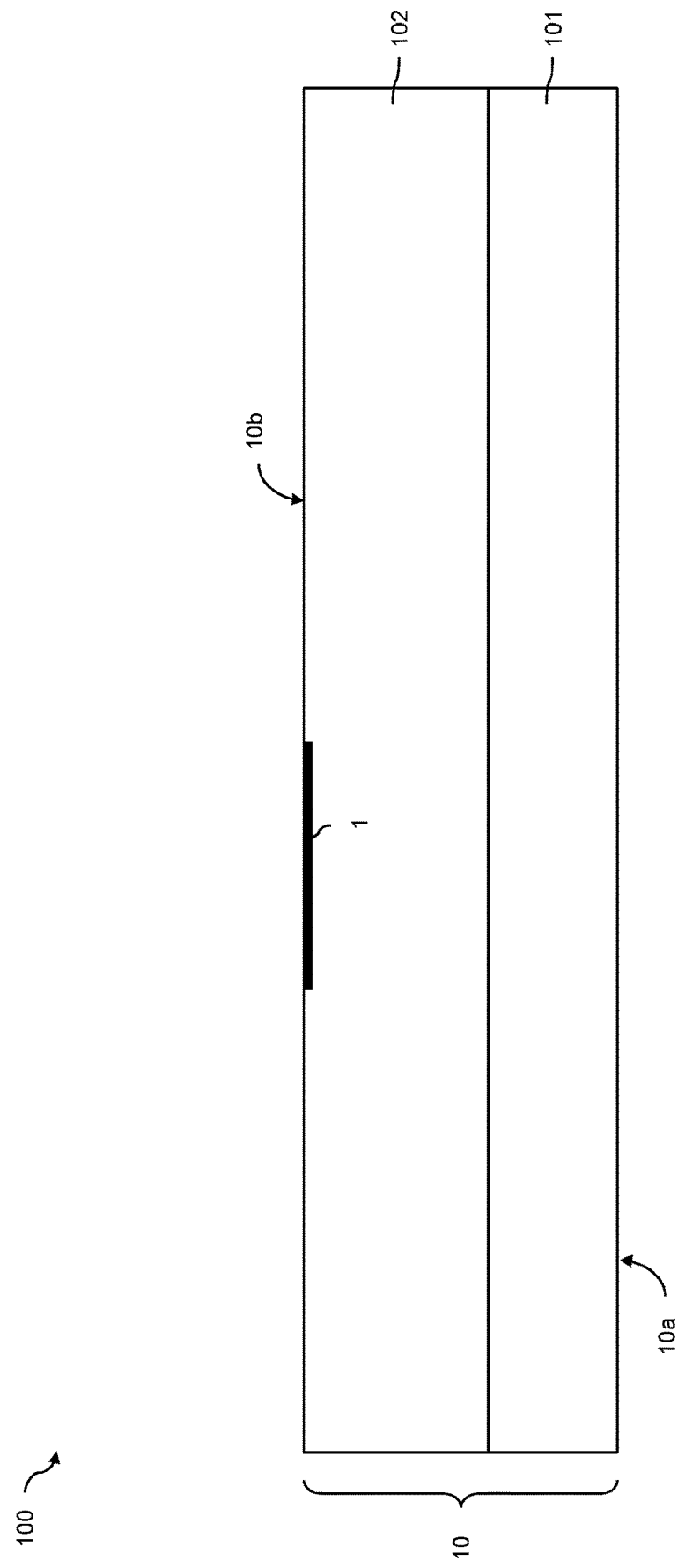

Turning to FIG. 10, a shallow and highly doped region 1 is created by a photo-masked implantation followed by resist removal and laser thermal annealing. The highly doped region 1 has n-type conductivity and extends to the surface 10b. The doping concentration might be in the range of $10^{20}$ atoms/cm$^3$ to $10^{22}$ atoms/cm$^3$. In laser thermal annealing, the wafer is subjected to very short heat pulses so that the heat can penetrate in the silicon only to a limited depth depending on the pulse time, energy dose and wavelength. The depth of the highly doped region might be in the range of 50 nanometers to 200 nanometers, which is far less than the thickness T2 of silicon epitaxial layer 102.

Figure 11:
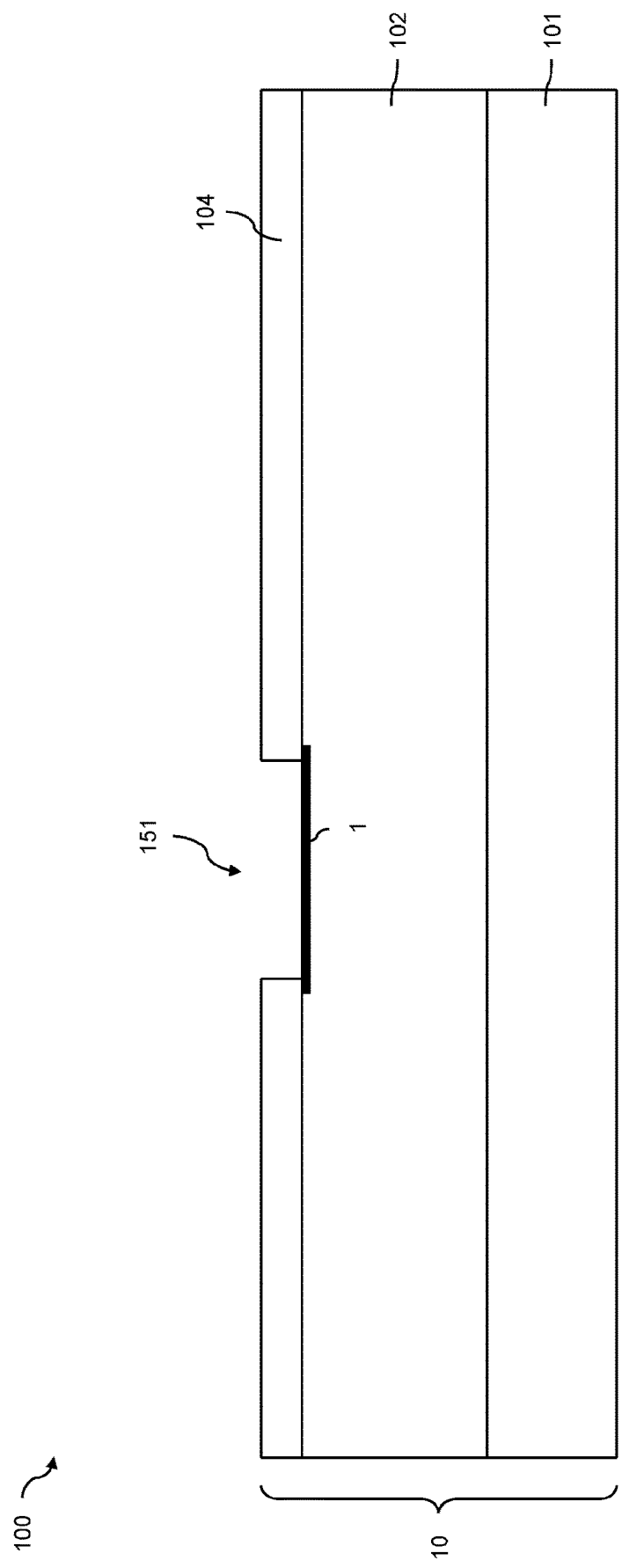

As depicted in FIG. 11, an oxide layer 104 is deposited on the surface 10b. The oxide layer might be tetraethyl orthosilicate (TEOS) deposited by plasma enhanced chemical vapor deposition (PECVD). By a photo-masked etching process, a contact trench or hole 151 is etched through the oxide layer 104 such that the highly doped region 1 becomes exposed. More precisely, the trench or hole 151 exposes the silicon epitaxial layer only within the highly doped region 1. As is known in the art, the silicon consumption of such a photo-masked oxide etch can be quite low depending on the oxide-to-silicon selectivity of the etch chemistry and condition. In this way the etch can be stopped within the shallow highly doped region 1 ensuring that the doping concentration at the silicon surface inside of the trench or hole 151 is in the range of $10^{20}$ atoms/cm$^3$ to $10^{22}$ atoms/cm$^3$.

Figure 12:
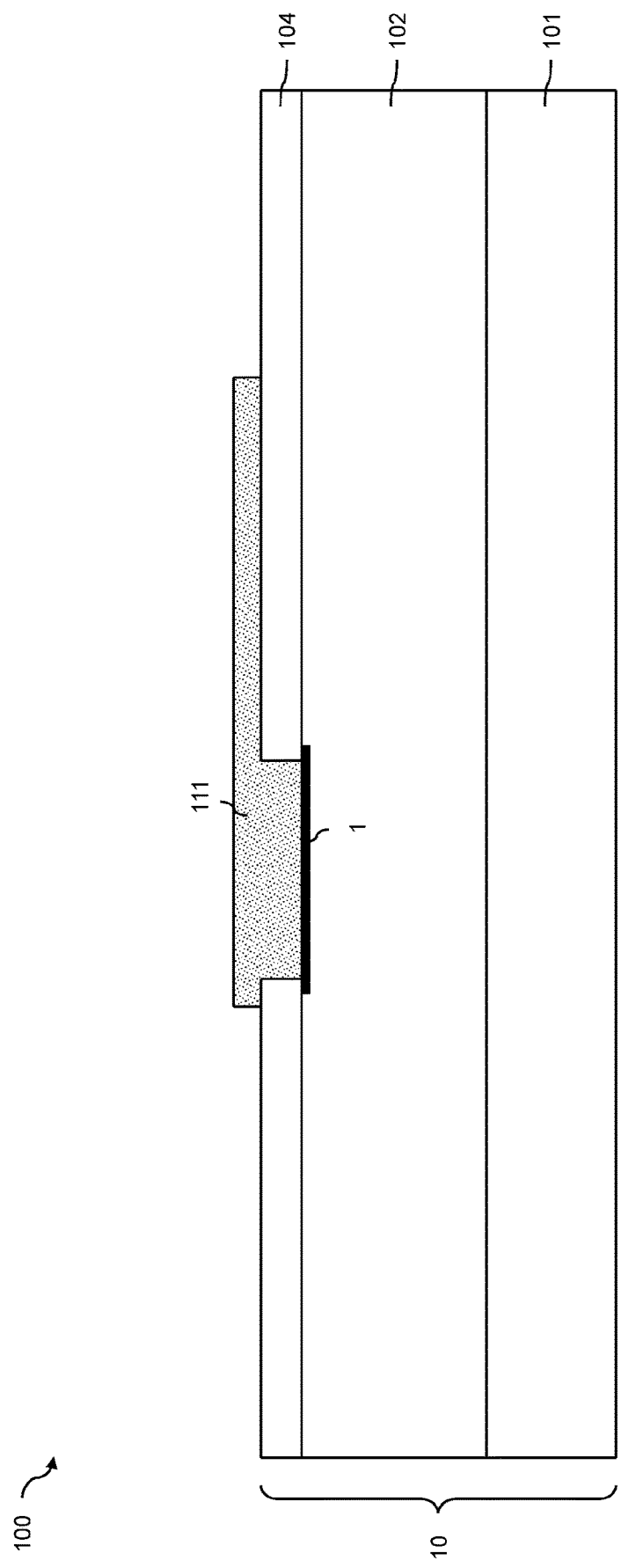

The fabrication of the Hall sensor continues with the deposition of a metal layer, which is structured by a photo-masked etching step as shown in FIG. 12. The metal layer is preferably an aluminum-based metal stack typically comprising a titanium adhesion layer, a titanium nitride barrier layer, an aluminum layer and titanium nitride cap layer. The thickness of the titanium nitride barrier layer might be increased compared to a typical thickness. In any case, the inventors consider a thickness in the range of 500 angstrom to 1500 angstrom as suitable. The metal structure 111 fills the contact trench or hole 151 such that the metal is in contact with the exposed highly doped silicon inside of the trench or hole. Furthermore, the metal structure 111 extends to the right side in FIG. 12 forming a wire or pad on top of the oxide layer 104.

Further metal structures are created on top of the oxide layer 104, which are provided as alignment marks for the processing of the wafer 10 on the second surface after its thinning as will become clearer in the following. The provided metal alignment structures are not shown in FIG. 12.

Figure 13:
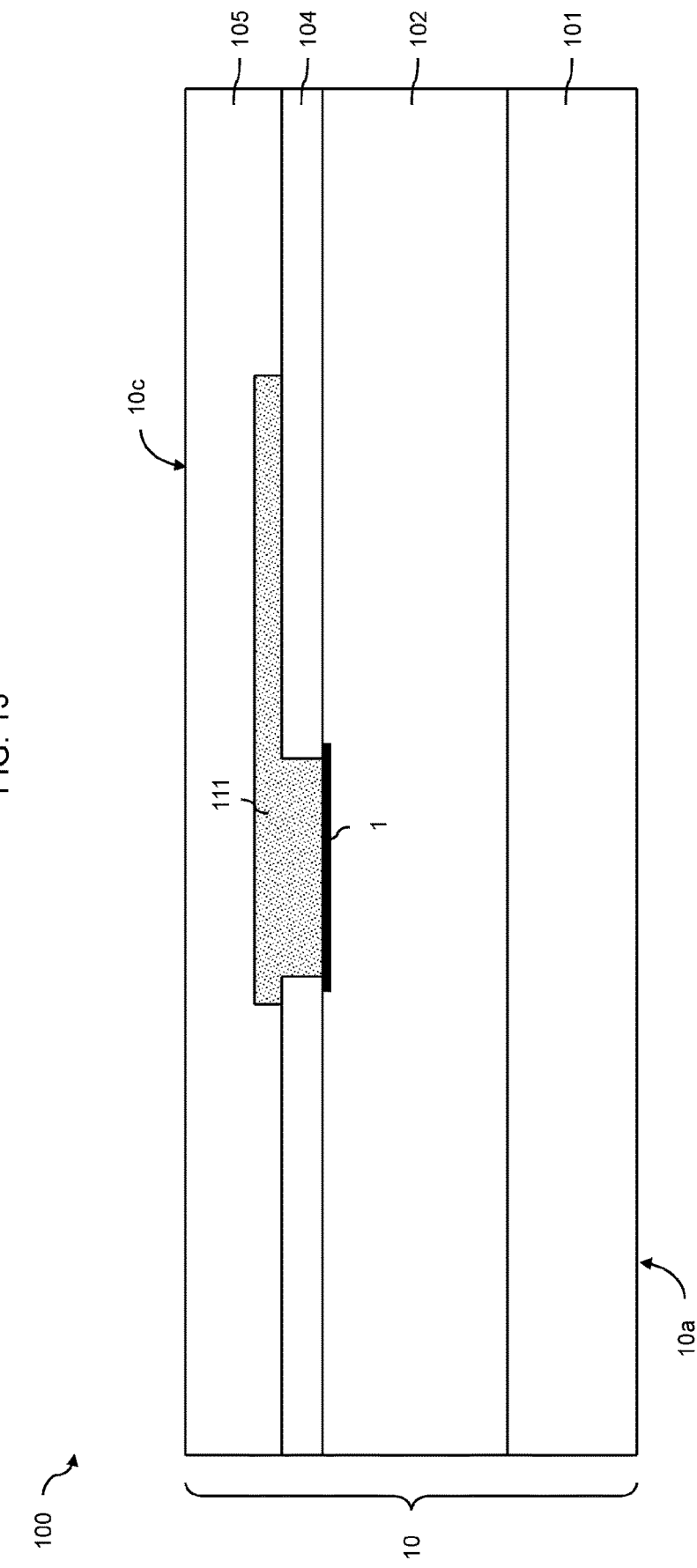

Turning to FIG. 13, an oxide layer 105 is deposited on top of the metal structure 111 and the exposed oxide layer 104. The oxide layer 105 is planarized by chemical-mechanical polishing (CMP). 10c denotes the top surface of the oxide layer 105 after planarization. To achieve a good flatness of the oxide surface 10c, the steps of depositing an oxide layer and performing CMP might be repeated several times.

Figure 14:
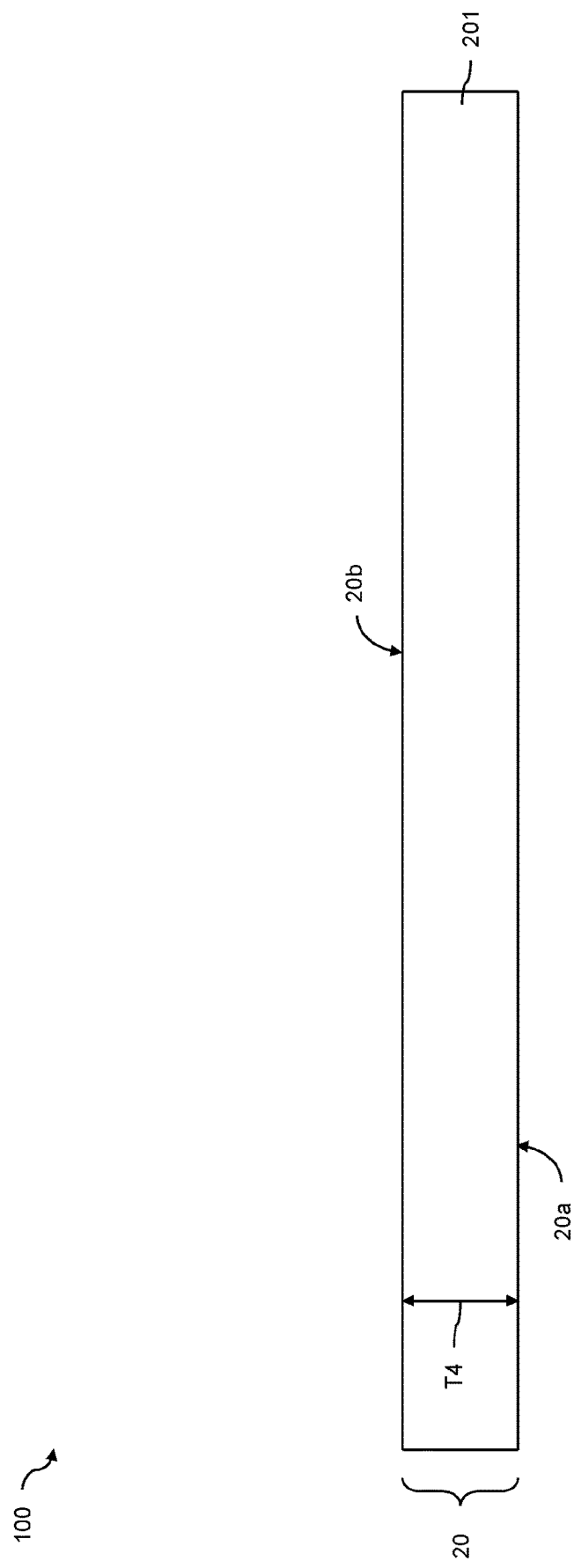
Figure 15:
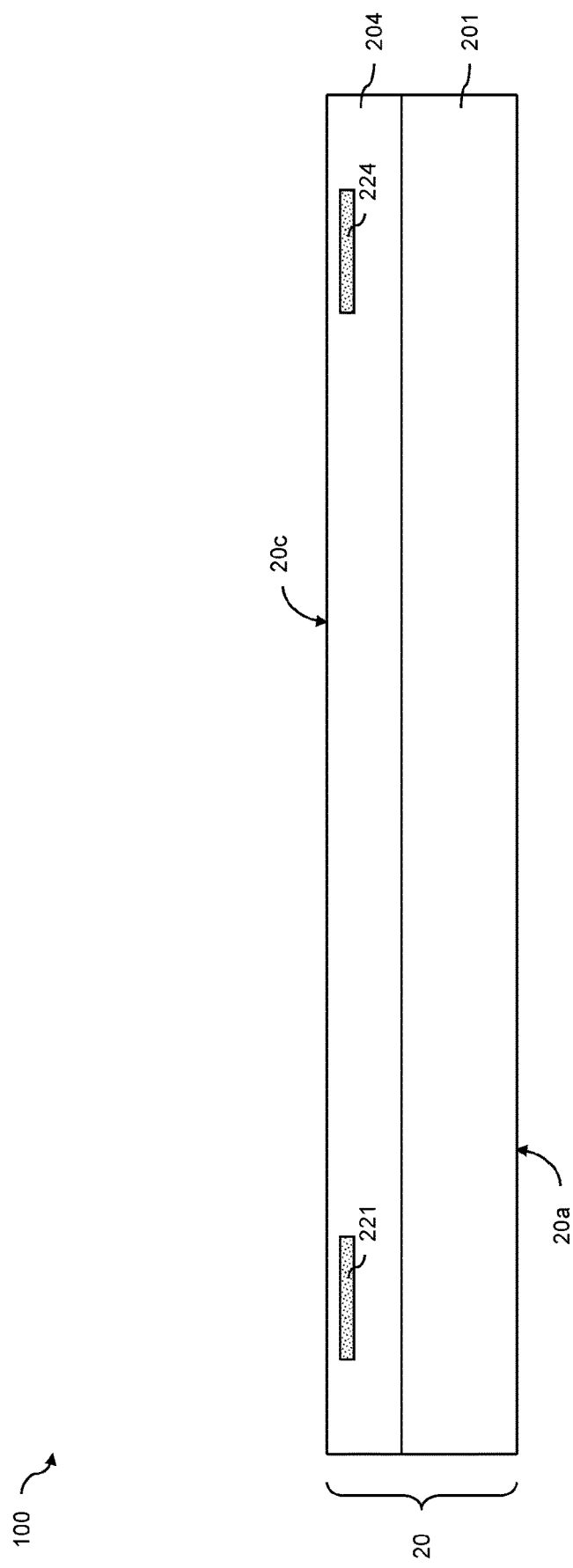

The description of the fabrication of the Hall sensor product 100 continues with the fabrication of the CMOS wafer part. As shown in FIG. 14, a wafer 20 is provided consisting of a silicon substrate 201. 20b denotes the top or frontside surface of the wafer 20, 20a denotes the rear surface. The substrate 201 has a p-type conductivity, which is the typical conductivity type used to form CMOS devices and circuits. Also, the resistivity of the substrate 201 might be chosen to be suitable for the formation and the mutual isolation of CMOS devices. The thickness T4 of the wafer might be in the range of 600 micrometers to 800 micrometers.

The required devices and circuits for the conditioning, read-out and signal amplification of the Hall sensor are formed on the substrate 201 in the typical fashion. To simplify matters these devices and circuits are not shown in FIG. 15. The circuit wiring is embedded in oxide layers, which are as whole denoted by 204 in FIG. 15. Two embedded metal pads, 221 and 224, preferably formed by the uppermost metal layer of the wiring, are provided for establishing contacts to the finished Hall sensor device being formed on the wafer 10. The uppermost metal layer might be an aluminum-based metal stack typically comprising a titanium adhesion layer, a titanium nitride barrier layer, an aluminum layer and titanium nitride cap layer. The thickness of the titanium nitride cap layer might be increased compared to a typical thickness. In any case, the inventors consider a thickness in the range of 500 angstrom to 1500 angstrom as suitable. The top surface of the oxide layer 204 is denoted by 20c. To achieve a high planarity of the surface 20c, chemical-mechanical polishing (CMP) is performed after the last step of oxide deposition. Also, a sequence of oxide deposition and CMP steps could be performed to further improve the flatness of the oxide surface 20c. No bonding pads are provided on wafer 20 for external communication.

Figure 16:
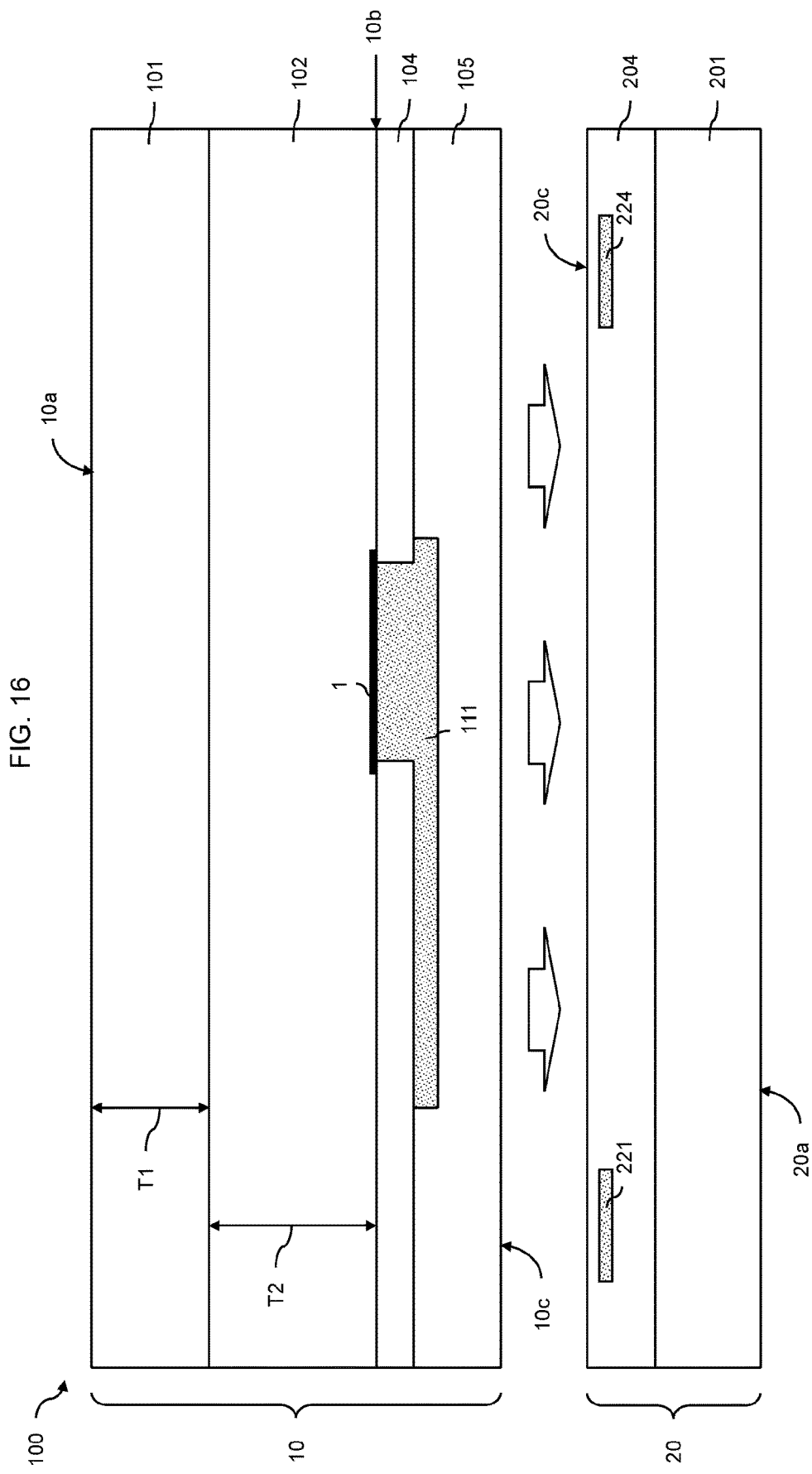

Turning to FIG. 16, the wafer 10 is flipped and attached with its surface 10c onto the surface 20c of wafer 20. A permanent bond is achieved between wafer 10 and wafer 20. The resulting stacked wafer is denoted by 30 in the following. The wafer 30 has surface 10a as top or front surface and surface 20a as rear surface. There are several methods for permanent wafer bonding known in the art. One example of a bonding process is described below. The planarized oxide surface 10c of wafer 10 is activated by a plasma with an inert gas. In the same way, the planarized surface 20c of the wafer 20 is activated by a plasma with an inert gas. Then the wafer 10 is flipped and attached with its surface 10c to the surface 20c of wafer 20. The bond alignment accuracy, i.e. the alignment accuracy with which wafer 10 is attached on wafer 20, is typically in the order of a few micrometers applying standard methods known in the art. A low temperature bake is performed to strengthen the bonding. The baking process may be in the range of lower than 450° C., preferably lower than 400° C. In theory, it is believed that the bonding relies on Van-der-Waals forces between the two oxide surfaces. As an alternative, for example, adhesive bonding using polymer adhesives such as benzocyclobutene (BCB) or others may be used as well to achieve a reliable bonding between the wafer 10 and the wafer 20.

Figure 17:
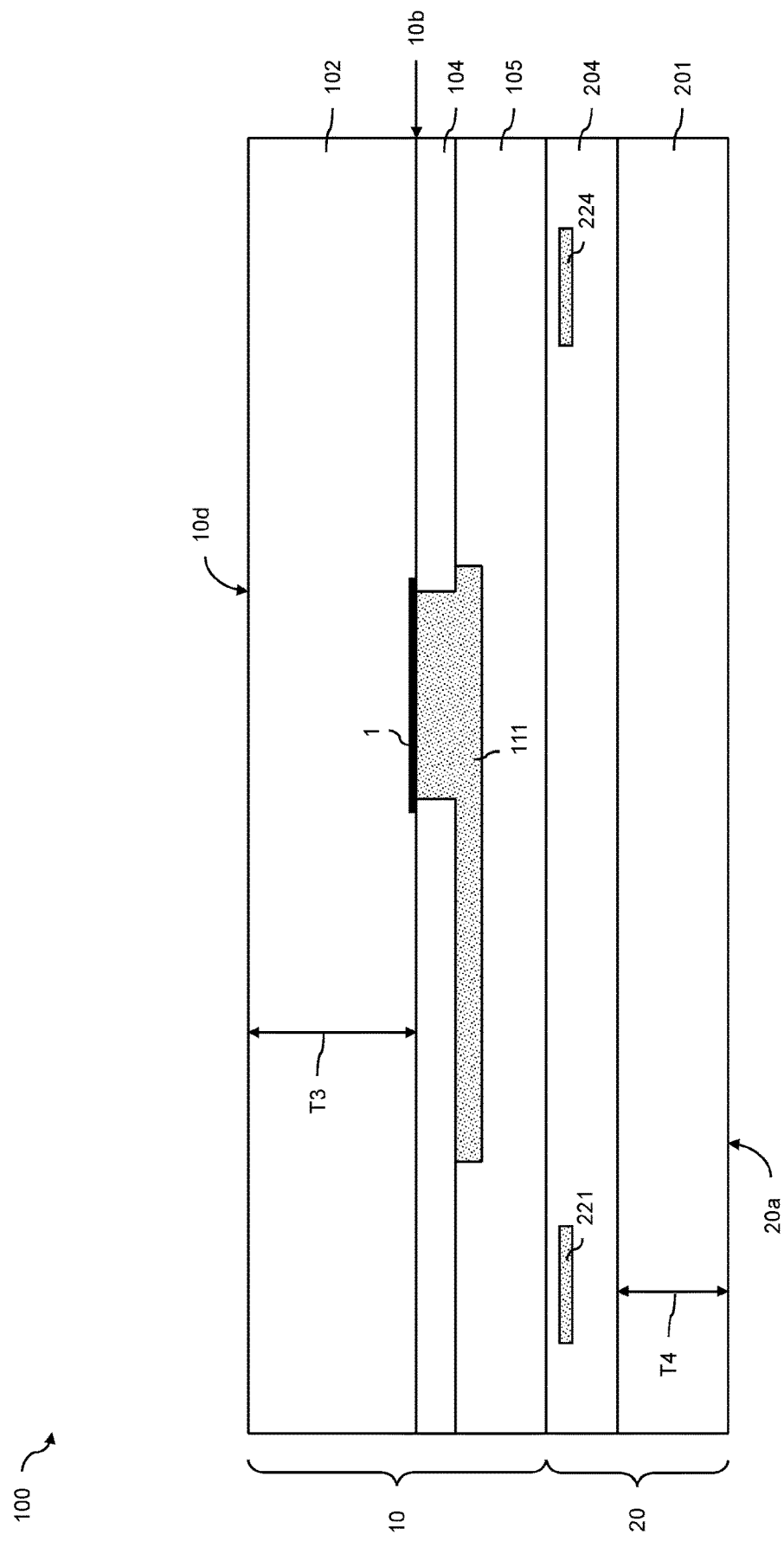

Using the CMOS wafer 20 as a carrier wafer, the Hall sensor wafer 10 is processed from its rear surface 10a. As shown in FIG. 17, the wafer 10 is thinned from the rear side removing most of the silicon material. In particular, the initial substrate 101 of wafer 10 is completely removed and also the thickness of the epitaxial 102 is slightly reduced. The resulting thickness T3 of the epitaxial layer 102 is slightly lower than the initial thickness T2. The resulting epitaxial surface is denoted by 10d. The thinning process can include removal processes such as back grinding, chemical-mechanical polishing (CMP) and wet or dry etching. A preferred method is described in the following. The bulk of the substrate 101 is removed by back grinding. The back grinding is stopped before the epitaxial layer 102 becomes exposed. Then a wet etch is performed which is selective to the doping concentration of the silicon material. Since the substrate 101 is preferably selected to have a high doping concentration, the wet etch can selectively be stopped on the lightly doped silicon epitaxial layer owing to the large difference in the doping concentrations. Then a CMP process might be performed to further planarize and smoothen the resulting silicon surface. With this approach a good wafer-to-wafer control of the thickness T3 as well as a good within-wafer uniformity of T3 can be achieved.

In the above, 10b has denoted the first silicon surface of the Hall sensor device. It has been shown how Hall terminals and accompanying wiring is formed on the first silicon surface by applying standard semiconductor processing methods with the only exception of the laser thermal annealing used for activation of the dopants. In the following, the fabrication of Hall sensor is continued by executing semiconductor manufacturing processes on the second surface 10d. To achieve a high degree of symmetry of the Hall sensor device, care is taken to apply identical design rules and process conditions for the formation of Hall terminals on the first and on second surface. As is understood, another important aspect to achieve the desired symmetry is the accurate alignment of the Hall terminals formed on the second surface 10d to the Hall terminals formed on the first surface 10b. As explained, alignment patterns have been created on the first surface by structuring the deposited metal layer accordingly. To make these alignment patterns visible on the second surface, silicon is removed by a photo-masked etch process in those regions, where the alignment patterns are conjectured. Due to the large size of the silicon openings required to catch the alignment patterns, these metal alignments patterns might be provided only at the edge of the wafer. The inventors appreciate, that the alignment accuracy, that can be achieved by applying the described method, lies in the range of 100 nanometers to 500 nanometers. Additionally, a new set of shot wise alignment patterns can be created on the second surface by a photo-masked etch into the epitaxial silicon, using the opened metal alignment patterns at wafer edge for alignment. In this way, the mutual alignment of the photo layers applied on the second surface 10*d* can be improved.

Figure 18:
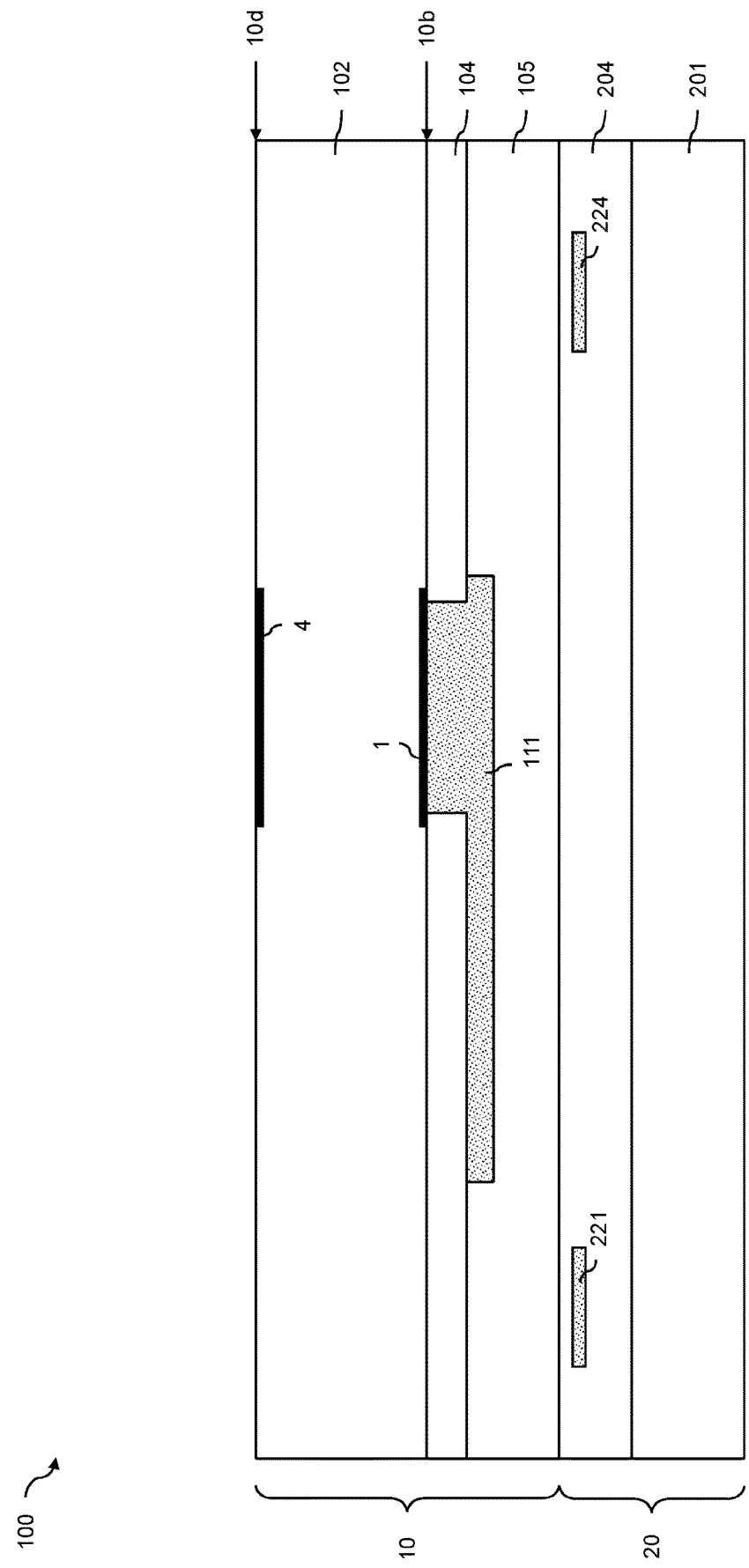

Continuing with FIG. 18, a shallow and highly doped region 4 having n-type conductivity is formed on the second surface 10*d* in the identical fashion as the highly doped region 1 on the first surface. Particularly, the same implant species, implant dose and energy are used as were used on the first surface to create the doping region 1. More particularly, the same laser thermal annealing condition is applied after resist removal as was applied on the first surface for activating doping region 1. As is will be understood by a skilled person in the art, by using laser thermal annealing for the dopant activation on the second surface, the aluminum-based metallization on the first surface of Hall sensor wafer 10 can be prevented from being ruined by heat treatment, in contrast to other activation methods such as furnace annealing or rapid thermal processing. Moreover, the laser thermal annealing does not add to the thermal budget of the devices formed on the CMOS wafer 20. The doped region 4 has the same lateral dimensions as the doped region 1. As indicated in FIG. 18, the doping region 4 is located directly above doping region 1. The two doping regions 1 and 4 are facing each other and are separated by the silicon epitaxial layer 102.

Figure 19:
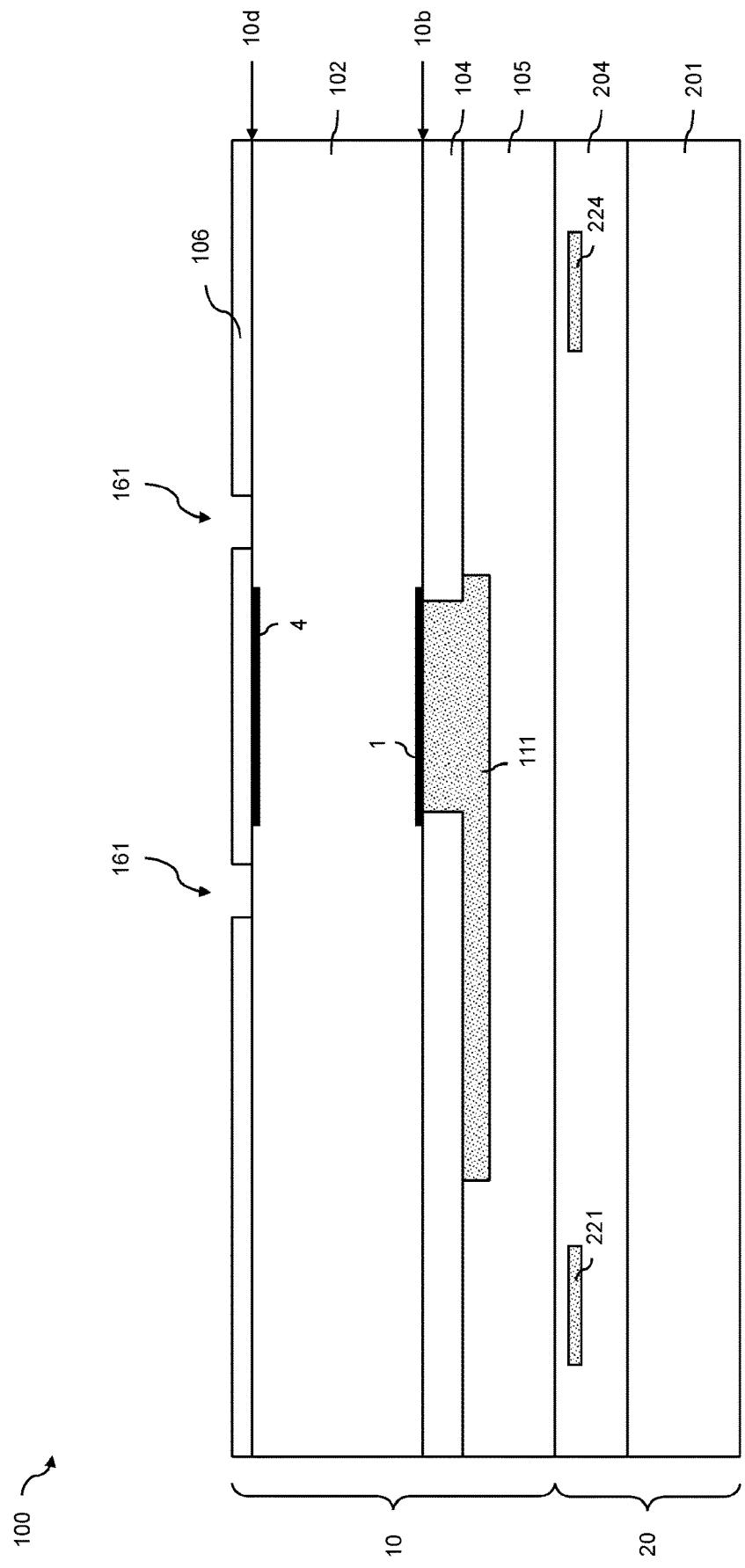

Turning to FIG. 19, the oxide layer 106 is deposited on the second surface 10*d*. More specifically, the layer 106 might be tetraethyl orthosilicate (TEOS) deposited by plasma enhanced chemical vapor deposition (PECVD). PECVD allows TEOS deposition at temperatures at or below 400° C. By a photo-masked etching process a ring-shaped opening 161 is etched through the oxide layer 106 exposing the silicon epitaxial layer 102. The ring-shaped opening is formed around the Hall sensor device. In the cross-sectional representation of FIG. 19, the ring-shaped opening of the oxide layer 106 appears as two openings, which are located on left and on the right side of the highly doped region 4.

Figure 20:
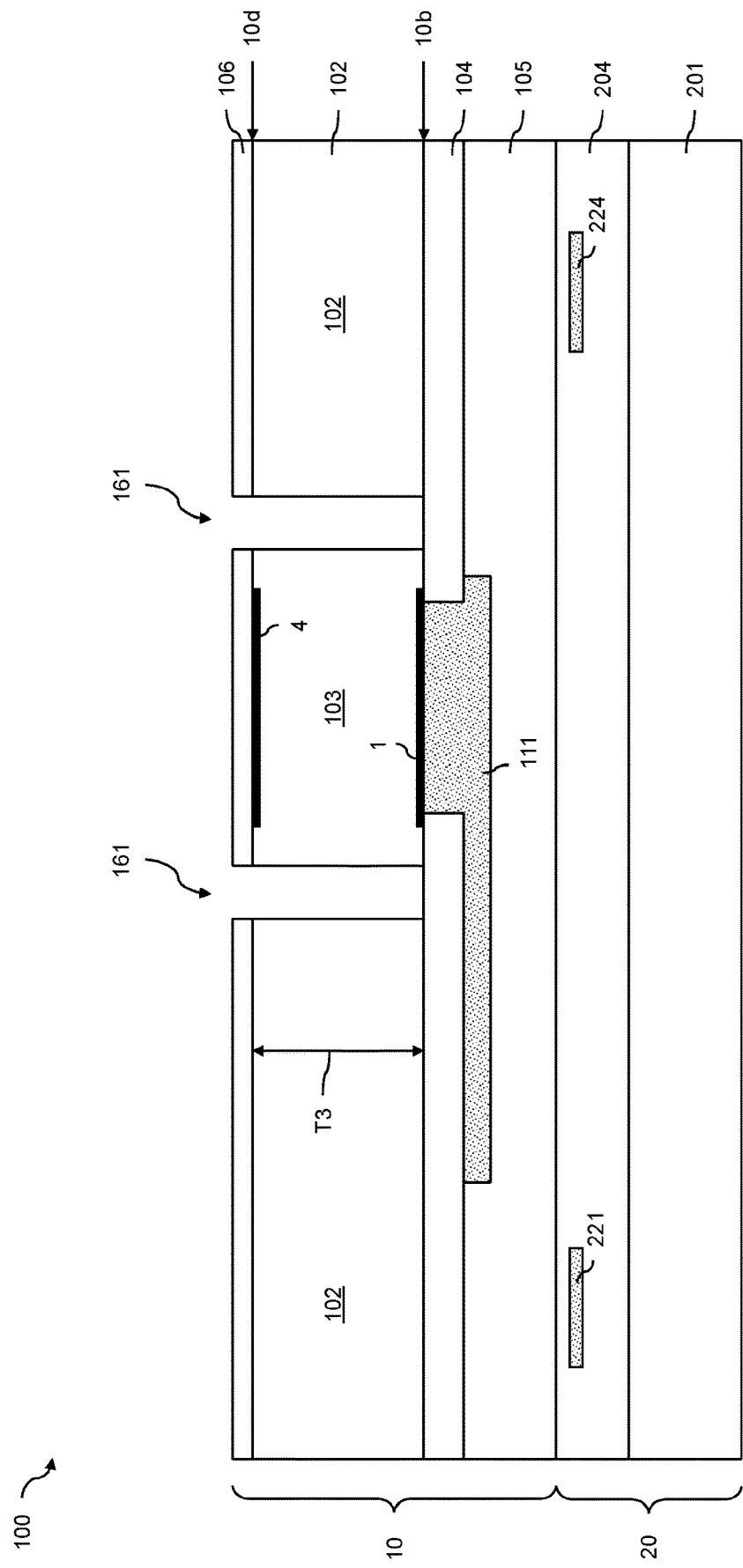

After removal of the photomask, a deep silicon etch is performed using the oxide layer 106 as hard mask, as depicted in FIG. 20. The deep silicon etch is stopped selectively on the oxide layer 104 deposited on the first surface 10*b* of the Hall sensor wafer 10. By etching through the entire depth of the epitaxial layer 102, a ring-shaped trench is created around the silicon region, in which the Hall terminals are formed. The enclosed silicon region will form the Hall plate of the finished Hall element and is denoted by 103. Deep silicon etching processes for etching trenches or vias having depths of several tens of micrometers or more are known in the art. For a given thickness T3 in the range of 10 micrometers to 30 micrometers, a plasma etch process using a gas chemistry consisting of $SF_6$, HBr and $O_2$ could be used. Alternatively, a so-called Bosch process could be applied, which typically is characterized by a better selectivity to the oxide hard mask. For both kind of etching processes nearly vertical sidewalls are obtained as is known by a person skilled in the art.

Figure 21:
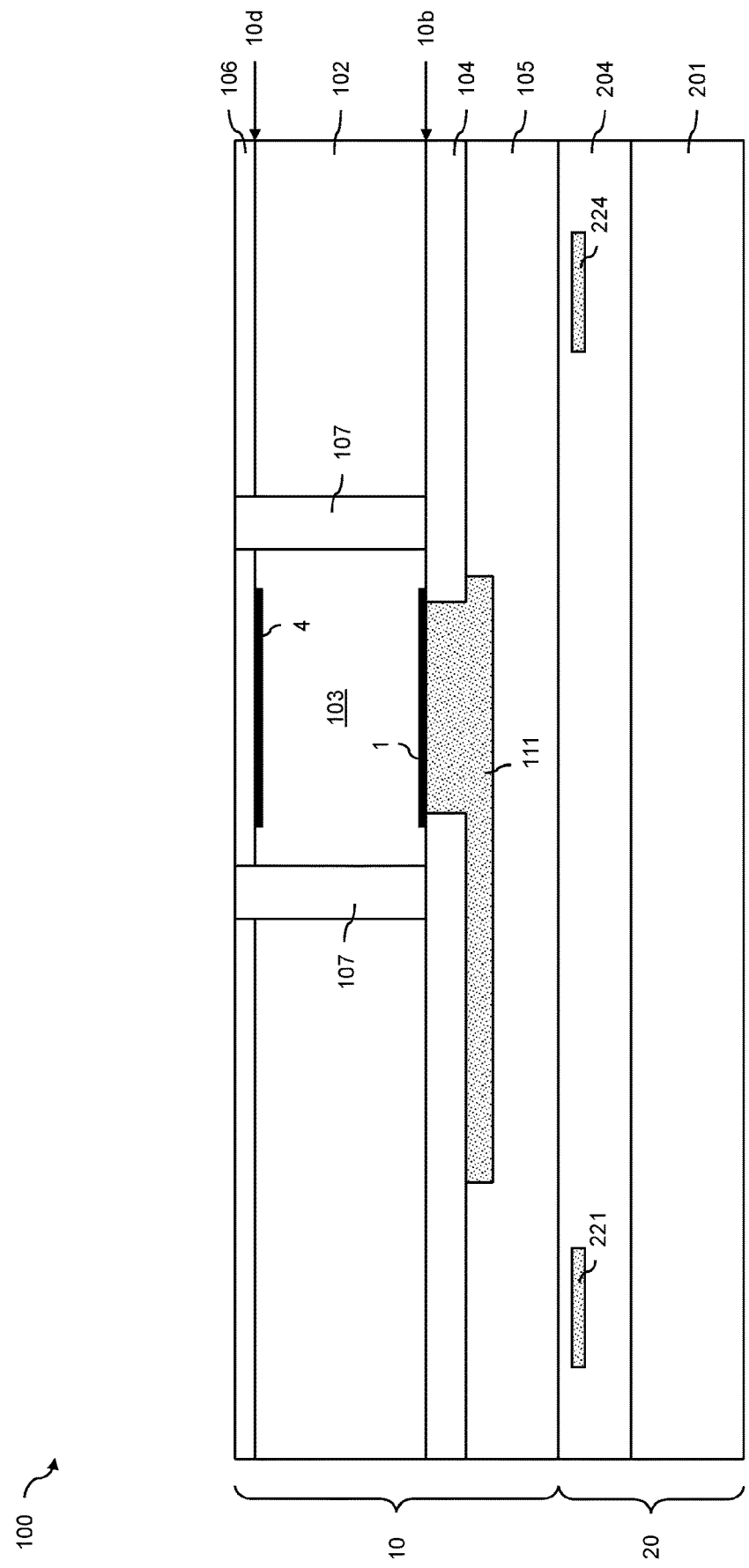

As is shown in connection with FIG. 21, the ring-shaped trench 161 is filled by dielectric material, which is removed on top of oxide layer 106 by chemical-mechanical polishing. The dielectric material could be tetraethyl orthosilicate (TEOS), or a spin-on dielectric such as spin-on-glass (SOG), polyimide (PI) or benzocyclobutene (BCB). In any case the dielectric material is selected among dielectric materials that may be processed at temperatures not above 400° C. The subsequent removal of dielectric material disposed on top of the oxide layer 106 by chemical-mechanical polishing is not selective to that oxide. The crucial point is only that the CMP process is stopped before silicon becomes exposed. After all, the Hall sensor region is confined dielectrically by deep trench isolation ring, in FIG. 21 denoted by 107.

Figure 22:
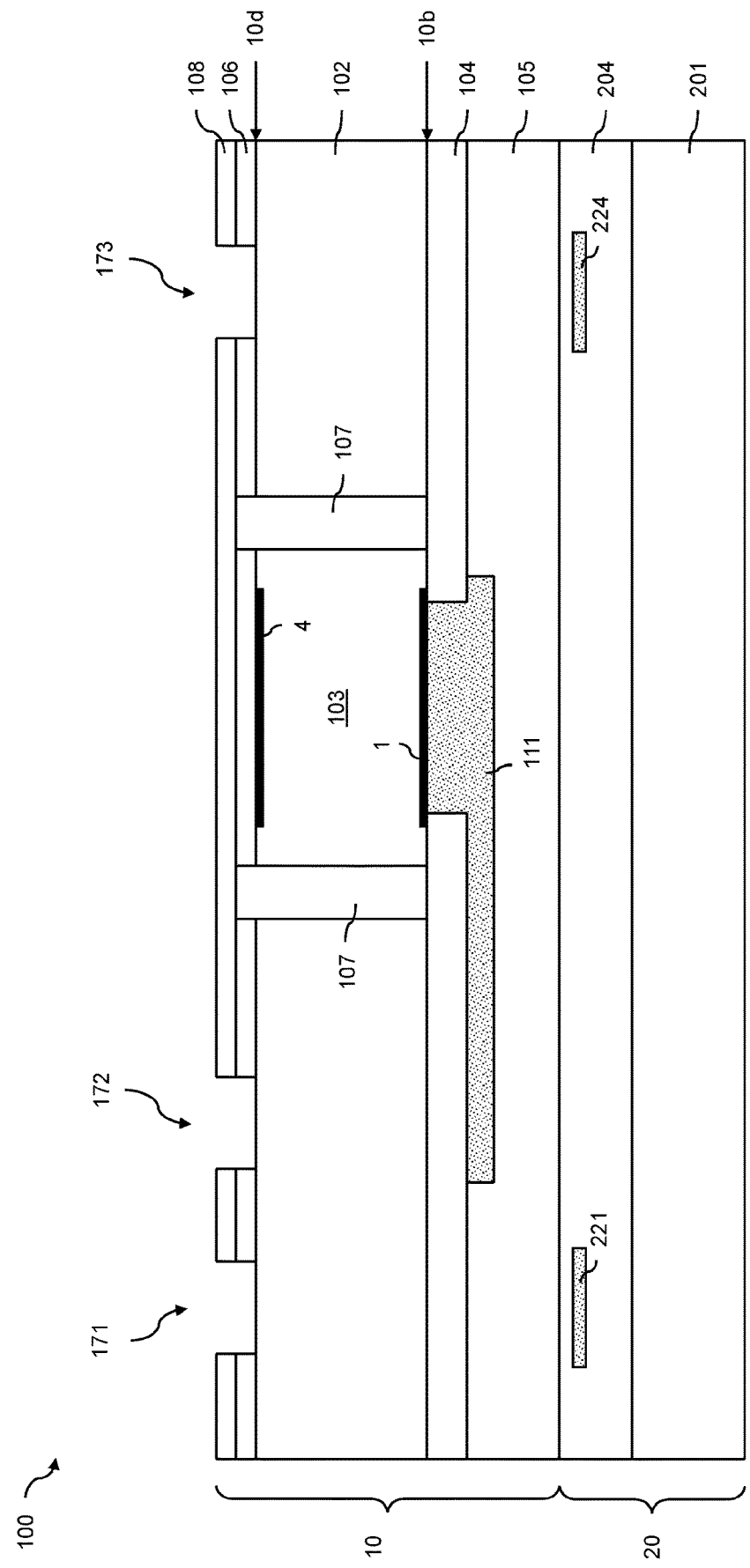

A silicon nitride layer 108 is deposited on top of the oxide layer 106 by PECVD as shown in FIG. 22. The deposition temperature is not above 400° C. Using a photo-masked etching process, the openings 171, 172 and 173 are etched through the stacked dielectric layer comprising the oxide layer 106 and the silicon nitride layer 108. At the bottom of the openings 171, 172 and 173, the underlying silicon epitaxial layer is exposed. The photoresist is stripped. In the cross-section diagram of FIG. 22, the opening 171 is located above the metal pad 221. View from top, the opening 171 is laterally enclosed by the metal pad 221, and the lateral enclosure of opening 171 by the metal pad 221 has a certain overlap margin, which is among others defined by the wafer bonding alignment accuracy. Likewise, the opening 173 is located above the metal pad 224 and is enclosed laterally by said metal pad with the same overlap margin. The opening 172 is located above the metal structure 111. At this position, the metal structure is formed as a metal pad providing laterally an enclosure to the opening 172. The overlap margin of the metal pad enclosure with respect to the opening 172 is among others defined by the alignment accuracy achieved between the two active silicon surfaces 10*d* of 10*b* of the Hall sensor wafer 10.

Figure 23:
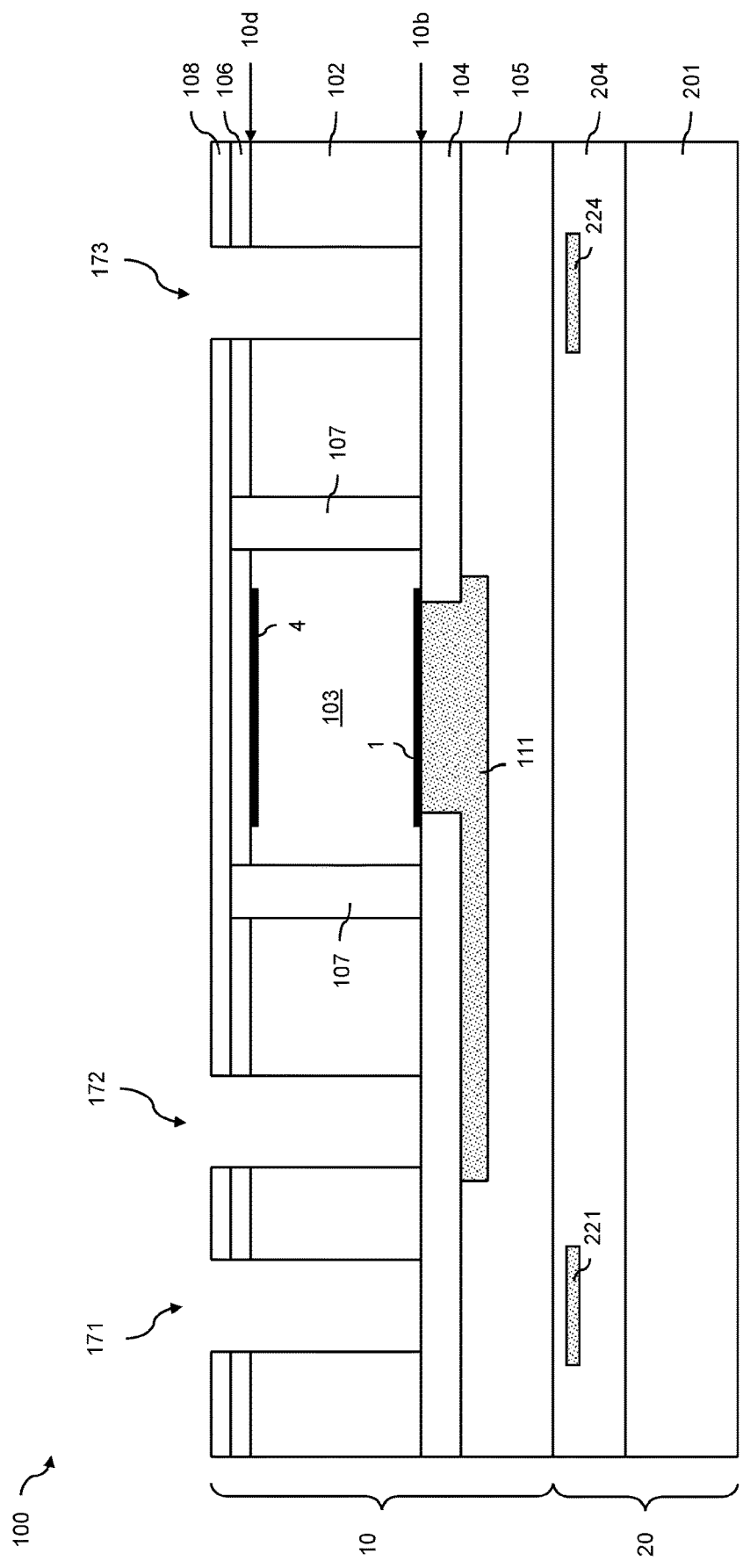

Referring to FIG. 23, a deep silicon etch process is executed using the silicon nitride layer 108 as hard mask. As similar dry etching process as used for the definition of deep trench isolation 107 can be applied for this purpose. The deep silicon etch is stopped selectively on the oxide layer 104.

Figure 24:
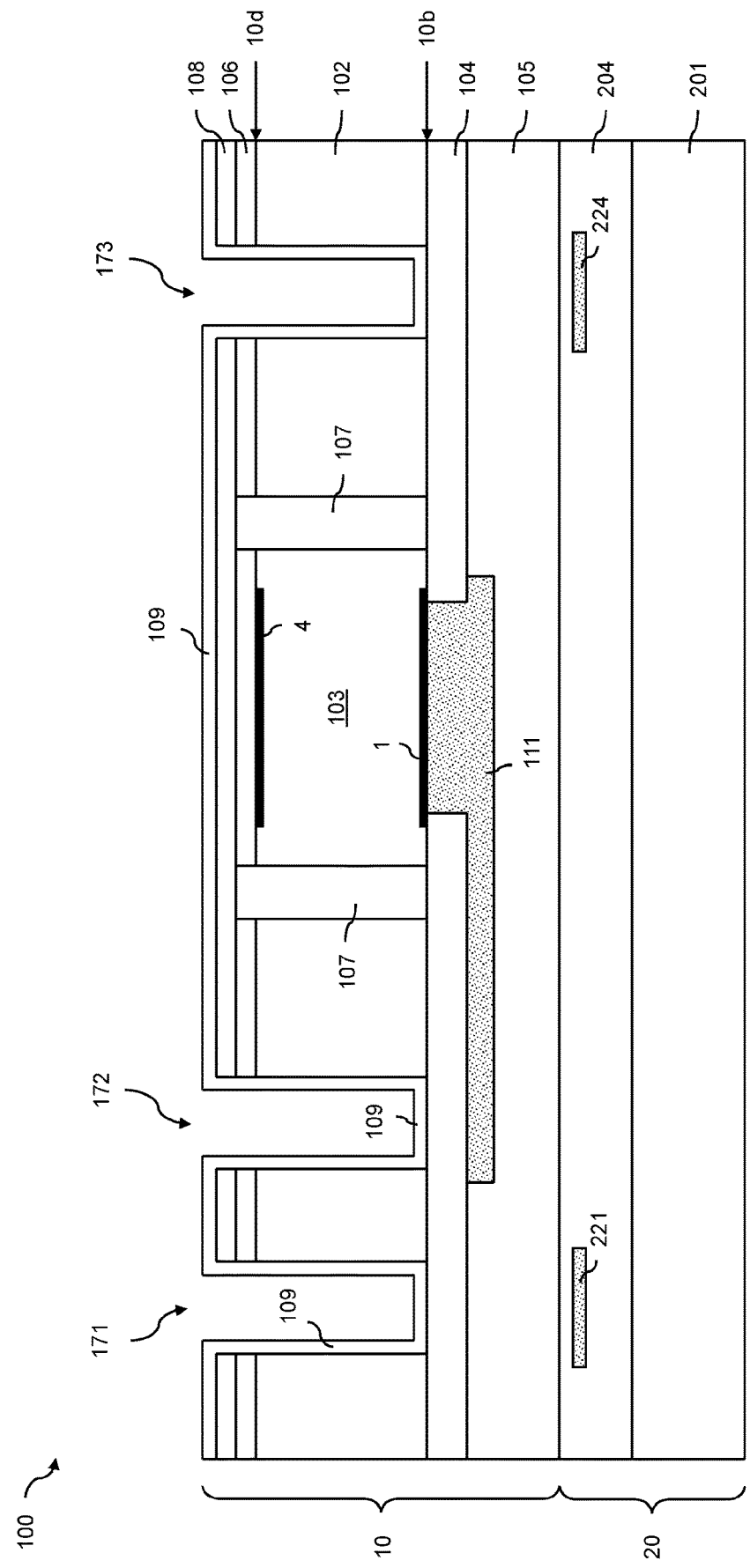

Turning now to FIG. 24, a thin oxide layer 109 is deposited. More specifically, the layer 109 might be tetraethyl orthosilicate (TEOS) deposited by plasma enhanced chemical vapor deposition (PECVD) at a temperature not above 400° C. The oxide layer 109 serves as a dielectric liner on the silicon sidewalls exposed by the preceding deep silicon etch. The thickness of the oxide layer 109 might be, to give an example, 3000 angstroms, but is not limited to this value.

Figure 25:
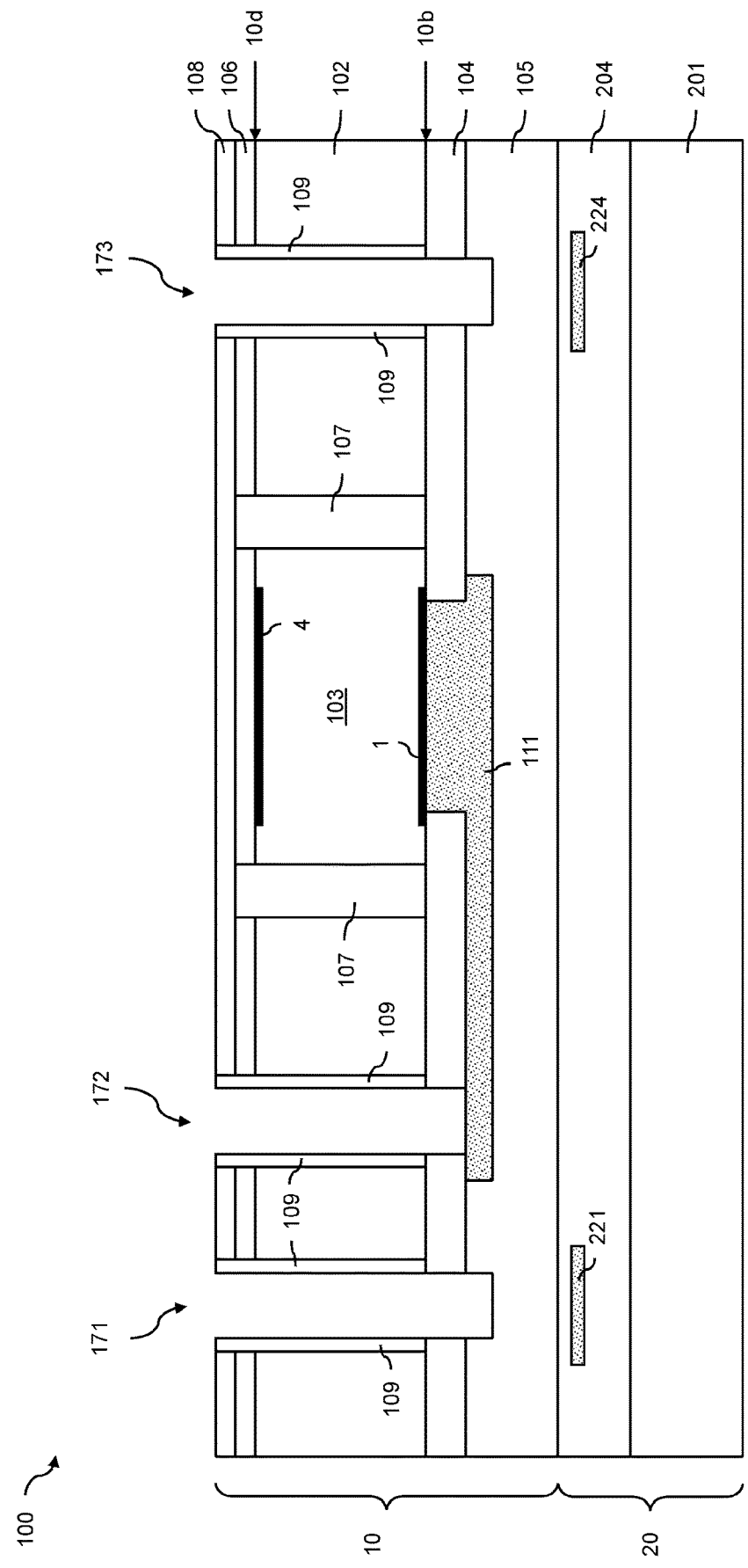

As shown in connection with FIG. 25, a further anisotropic dry etching process is executed using a process condition which suitable for etching oxide with high selectivity to silicon nitride and with high selectivity to titanium nitride. The thin oxide 109 is etched through at the bottom of the deep silicon vias 171, 172 and 173, as well as on the top above the silicon nitride layer 108. Owing to the high degree of anisotropy of such etching processes, the oxide layer 109 is kept almost entirely on the silicon sidewalls of the vias 171, 172 and 173. As etching is proceeded, the oxide layer 104, deposited on the first surface of wafer 10, is etched through as well. In the via opening 172, the dry etching stops selectively in the titanium nitride barrier layer of the metal structure 111. Using typical polymer-rich fluorocarbon etch chemistries in conjunction with oxygen and argon, oxide-to-titanium nitride selectivity of 20:1 to more than 40:1 can be obtained as is known in the art. Owing to the increased thickness of the titanium nitride barrier layer of metal structure 111 and owing the high selectivity of the etching process, the etch can be stopped within said titanium nitride layer and aluminum does not become exposed. Such etching processes typically show also a high selectivity to silicon nitride, so that in the present case the silicon nitride layer 108 is preserved to a large extent. In the via openings 171 and 173, the etch might stop somewhere in the oxide layer 105 depending on the applied etch time, as indicated in FIG. 25.

Figure 26:
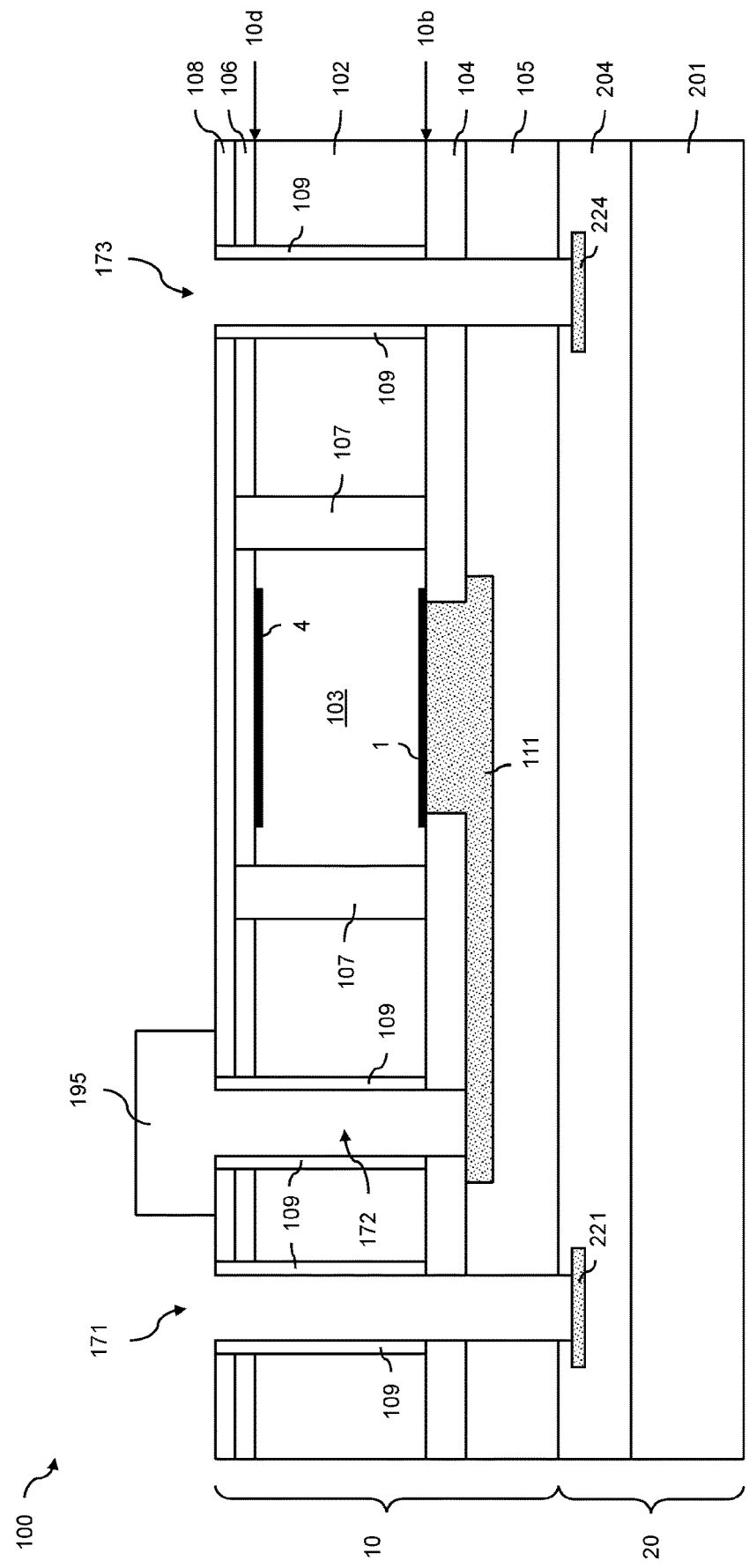

Subsequently, a photo step is performed with the result that at least the via 172 is filled and covered by photoresist and the vias 171 and 173 are not filled and covered by photoresist. In FIG. 26, photoresist coverage 195 is limited to the via 172 with some overlap around the via. A further dry oxide etching process is executed with high oxide-to-titanium nitride selectivity. In the vias 171 and 173, the oxide layer 105 is etched through and as etching is continued, the metal pads 221 and 224 are reached, respectively. Owing to the selectivity of the oxide etching process and the increased thickness of the titanium nitride cap layer of the metal pads 221 and 224, the etch can be stopped within said titanium nitride layer without the underlying aluminum becoming exposed. Since the via 172 is filled and covered by photoresist, no etching occurs at the bottom of this via. In the areas, which are not covered by photoresist, the silicon nitride layer 108 serves as hard mask. After completion of the oxide etching process, the photoresist 195 is stripped.

Figure 27:
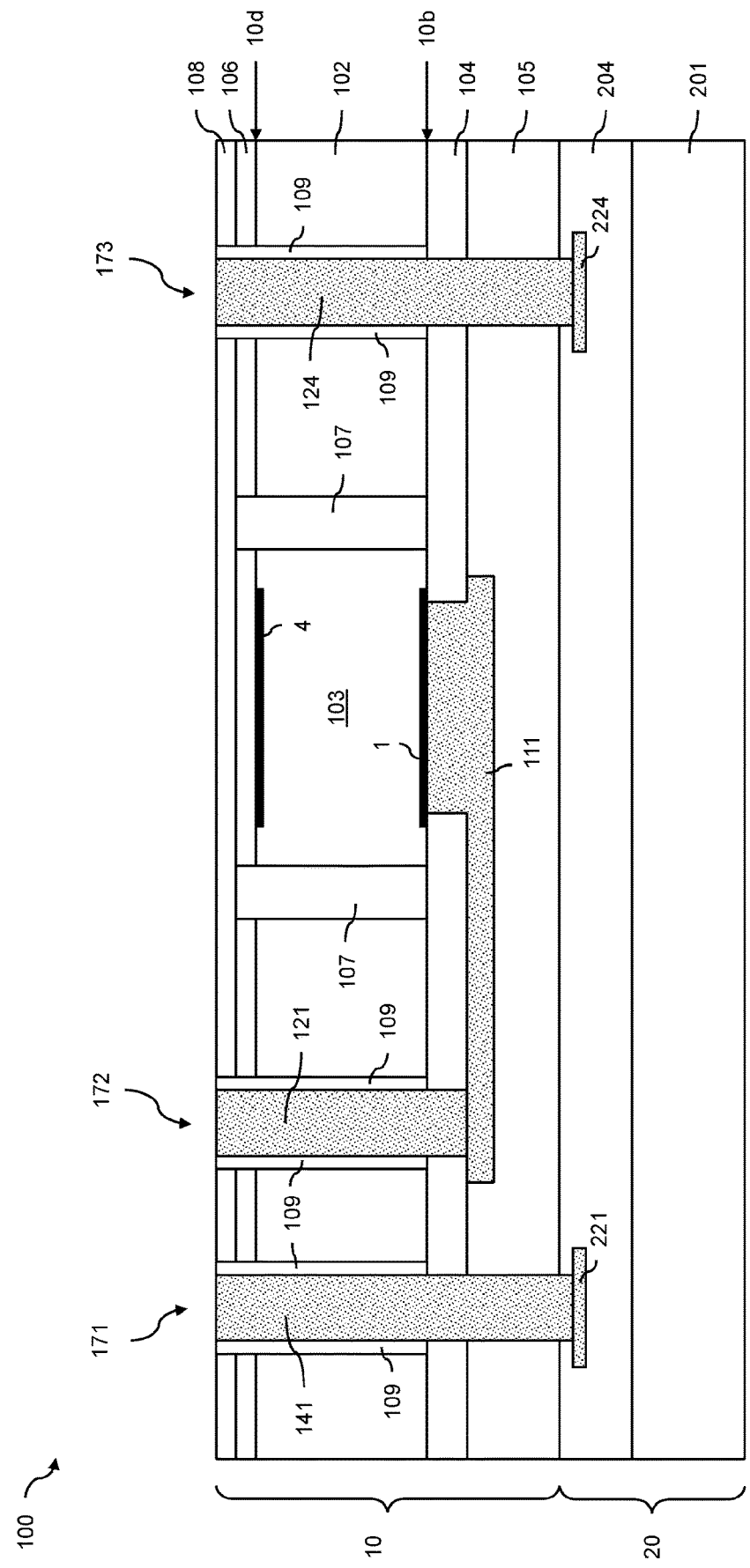

The description of the fabrication process continues with reference to FIG. 27. A tantalum adhesion layer, an optional tantalum nitride barrier layer and a copper seed layer are deposited. After that, the vias 171, 172 and 173 are filled with copper by electroplating. Owing to additives given to plating chemistry and by careful adjustment of the plating rate, the vias 171, 172, and 173 can be filled with copper without leaving voids or seams. Methods for filling through silicon vias of high aspect ratio with electroplated copper without voids or seams are known in the art. After electroplating, a copper CMP process is applied to remove copper plated on top of the silicon nitride layer 108. By the copper CMP process also the tantalum and tantalum nitride deposited on top of the nitride layer 108 is completely removed. By filling of the vias 171, 172 and 173 with conductive material, through silicon vias are formed, which are denoted by 141, 121, and 124, respectively. The through silicon vias are electrically isolated from the surrounding epitaxial silicon 102 by the oxide liner 109. By landing on the metal pad 221, the through silicon via 141 establishes an electrical connection to the wiring of the CMOS wafer 20. Similarly, the through silicon via 124 establishes an electrical connection to the wiring of the CMOS wafer 20 by landing on the metal pad 224. With the through silicon via 121 landing on the metal structure 111, an electrical connection to the highly doped region 1 formed on the first surface of the Hall sensor wafer 10 is achieved.

Figure 28:
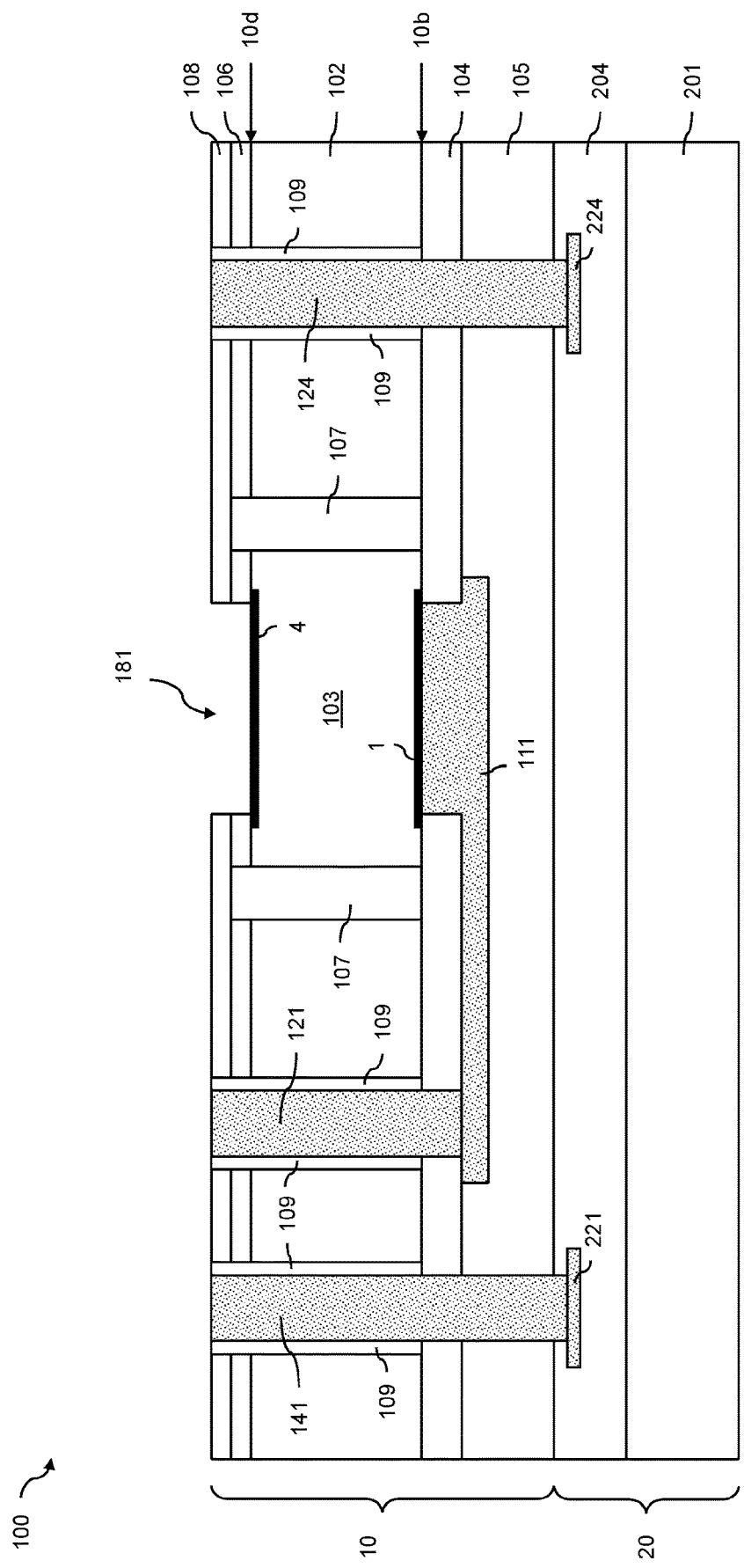

Turning to FIG. 28, a contact trench or hole 181 is formed by a photo-masked etching process through the silicon nitride layer 108 and through the oxide layer 106 such that the highly doped region 4 becomes exposed. More precisely, the trench or hole 181 exposes the silicon epitaxial layer only within the highly doped region 4. Thanks to the set of shot wise alignment patterns created on the second surface 10d, both, the photo process for the definition of the doped region 4 and the photo process for the definition of the opening 181, can be aligned to the same set of alignment patterns ensuring a high degree of mutual overlay accuracy. Thanks to a high selectivity towards silicon the etching can be stopped within the shallow highly doped region 4 ensuring that the doping concentration at the silicon surface inside of the trench or hole 181 is in the range of $10^{20}$ atoms/cm$^3$ to $10^{22}$ atoms/cm$^3$. After finishing the photo-masked etching process, the photomask is stripped.

Figure 29:
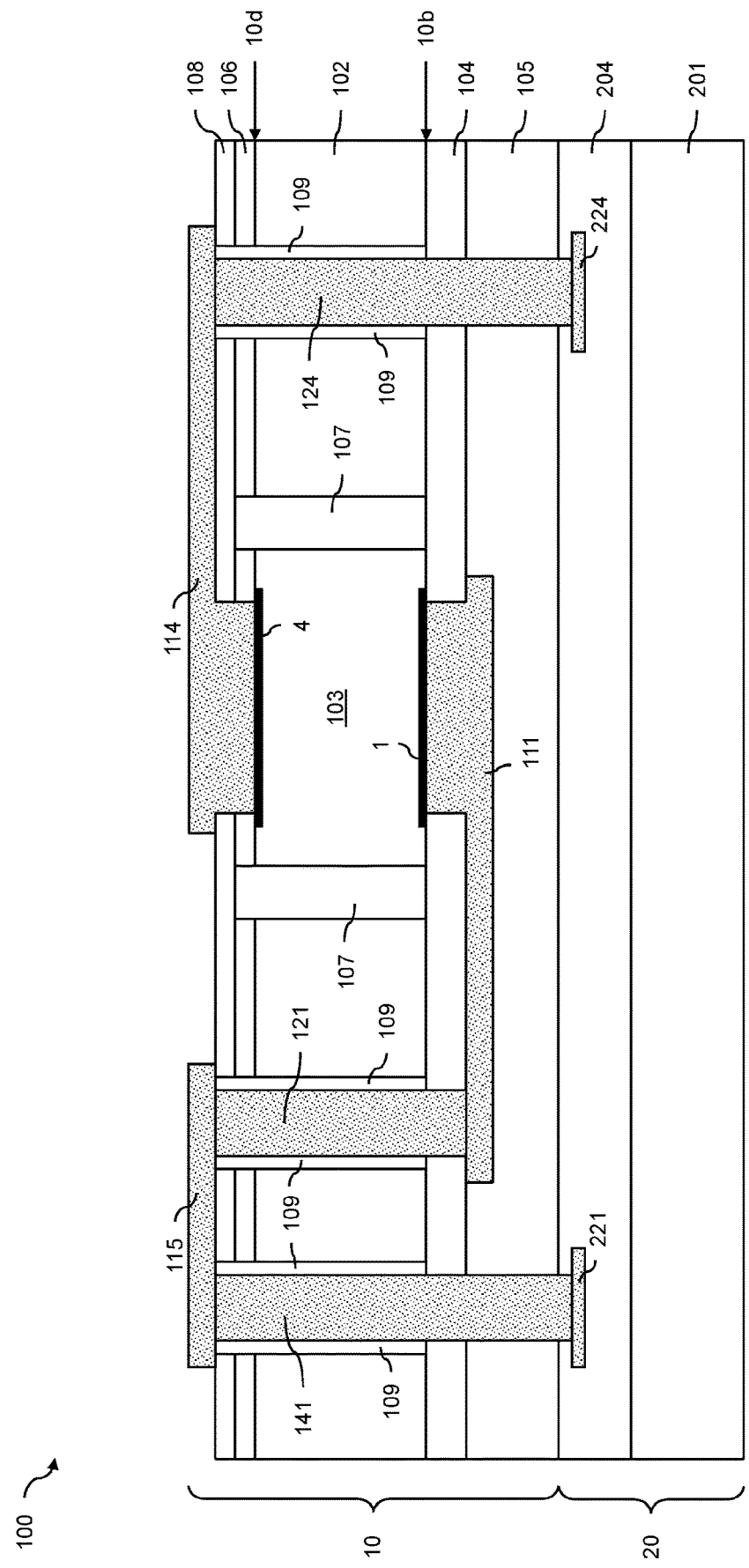

A metal layer is deposited filling the contact trench or hole 181. The metal layer could be an aluminum-based metal stack comprising a tantalum adhesion layer, a tantalum nitride barrier layer, an aluminum layer and titanium nitride cap layer. After deposition, the metal layer is structured by photo-masked etching process as shown in FIG. 29. As depicted, the metal structure 115 fully covers the top surface of the copper filled through silicon via 141 and top surface of the through silicon via 121, achieving an electrical connection between the two through silicon vias. The metal structure 114 comprises the filling of the contact trench or hole 181. The metal structure 114 extends to the right side passing over the deep trench isolation 107 and covering fully the top surface of the copper filled through silicon via 124. Thus, the metal structure 114 provides an electrical connection between the highly doped region 4 formed in the epitaxial silicon and the through silicon via 124.

The structuring of the deposited aluminum-based metal stack is used also to form bonding or bumping pads for external communication of the finished wafer-stacked Hall IC product. The bonding or bumping pads, not shown in FIG. 29, are electrically connected to the wiring on the CMOS wafer 20 by through silicon vias like 141 or 124, which land on corresponding metal pads like 221 or 224, provided on wafer 20.

Figure 30:
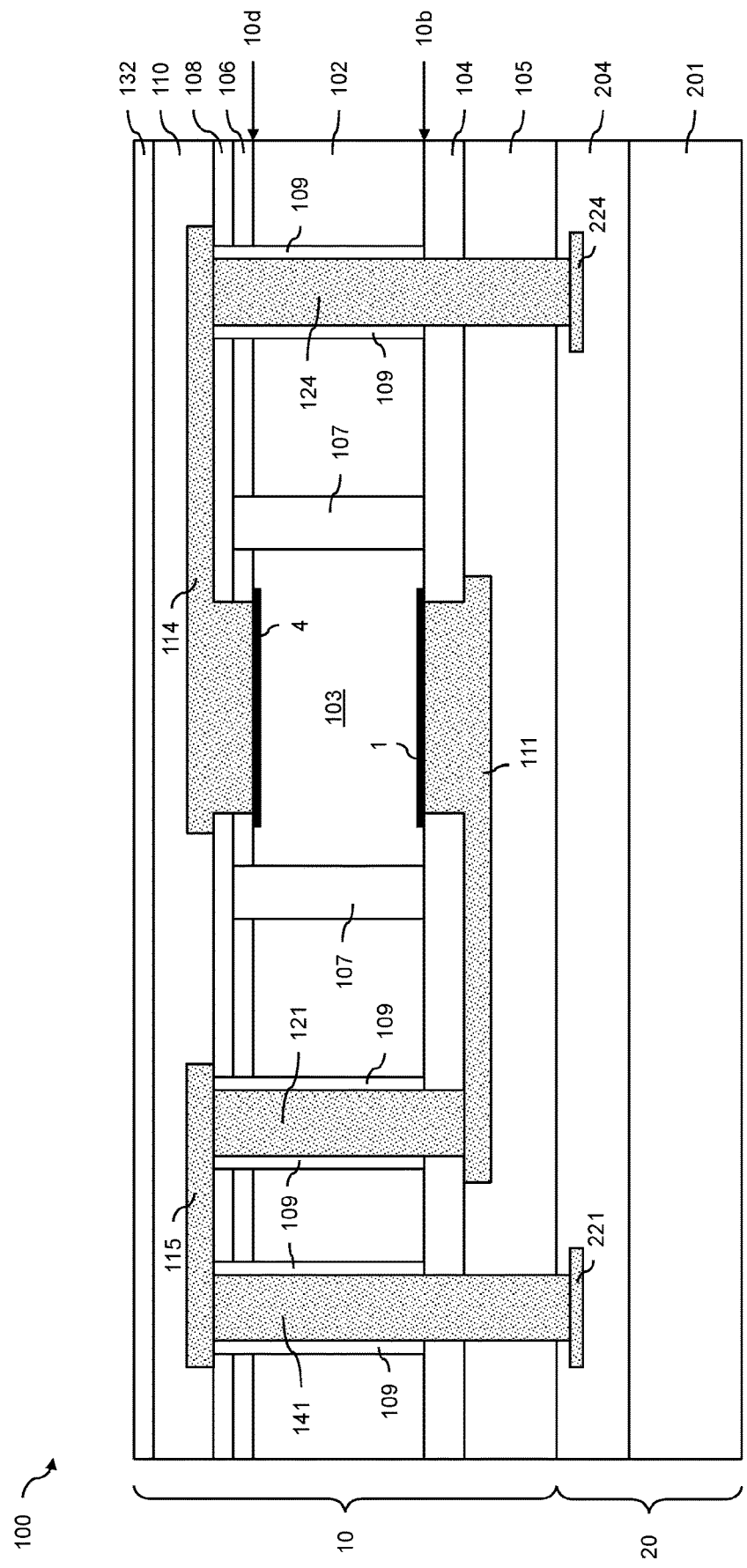

Turning to FIG. 30, an oxide layer 110 is deposited on top of the metal structures 115 and 114, and on the remaining silicon nitride layer 108. Then a silicon nitride layer 132 is deposited serving as passivation for the finished product. Both deposition steps are conducted at temperatures not above 400° C. using plasma enhanced physical vapor deposition. The oxide/silicon nitride stack is opened above the bonding or bumping pads by a photo-masked etching process, which is not shown in FIG. 29.

The advantages of the present solution are evident from what discussed above.

The proposed solution solves the problem of the low sensitivity of conventional vertical Hall elements integrated in Hall ICs. For the vertical Hall element established on the first wafer a high sensitivity can be achieved since the Hall terminals on the first surface and the Hall terminals on the second surface of the epitaxial semiconductor can be arranged such that in each phase of device operation the operating current flows vertically to a line connecting the two Hall terminals between which the Hall voltage is measured. In this way, short-circuit effects are minimized, which in conventional vertical Hall elements commonly reduce the sensitivity. A high sensitivity for the vertical Hall element can be achieved with the proposed solution also, because the thickness of the epitaxial semiconductor layer can be optimized towards a high sensitivity. In principle, the proposed technical solution allows to use an epitaxial semiconductor material other than silicon as Hall plate. As is known in the art, the Hall sensitivity is proportional to the mobility of the majority carriers. The sensitivity can thus be further enhanced by selecting an optimized semiconductor material with high mobility. For instance, low-doped germanium with n-type conductivity could be selected as an alternative material. In general, the vertical Hall element formed on the first wafer can be optimized with respect to sensitivity without modifying the semiconductor manufacturing processes, materials or design rules applied for the fabrication of the wafer containing the integrated circuits of the Hall IC.

The proposed solution moreover solves the problem of high residual offset of conventional vertical Hall elements integrated in Hall ICs, since the vertical Hall element established on the first wafer can be designed and manufactured to have a four-fold symmetry. A four-fold symmetry can be achieved in the design of the vertical Hall element since the technical solution allows to place Hall terminals on both sides of the epitaxial semiconductor layer constituting the Hall plate. In this way, four Hall terminals of the vertical Hall element can be arranged such that they display a four-fold symmetry like in horizontal Hall elements. Since an epitaxial layer is used to establish the Hall plate, a uniform dopant concentration can be assumed throughout the Hall sensor region. Moreover, the proposed technical solution allows to apply identical process conditions and design rules for the formation of the Hall terminals on the first surface and on the second surface of the epitaxial semiconductor. Moreover, as will be explained in the detailed disclosure, there are techniques available which allow to achieve a good overlay accuracy of the Hall terminals on the second surface with respect to the Hall terminals formed on the first surface of the epitaxial semiconductor layer. Moreover, the deep trench isolation ring confining the Hall plate can be arranged such that the four-fold symmetry is maintained.

Finally, it is clear that modifications and variants can be made to that described and illustrated herein, without departing from the scope of the present invention, as defined in the appended claims.

In particular, according to a further embodiment of the present solution, some CMOS circuitry are formed also on the first wafer 10 (with standard CMOS processing steps). With respect to the processing of the first wafer 10, in this embodiment, conditions have to be applied on the same first wafer 10, which are compatible with CMOS components (apart from this considerations, the manufacturing process does not deviate substantially from what discussed above). This further embodiment may allow to optimize silicon usage and achieve a lower manufacturing cost.

The invention claimed is:

1. A Hall integrated circuit including a vertical Hall element, comprising a first wafer and a second wafer stacked in a vertical direction, the second wafer comprising a CMOS substrate integrating a CMOS processing circuit configured to be coupled to the vertical Hall element and a stack of dielectric layers arranged on the CMOS substrate, and the first wafer comprising a Hall-sensor layer having a first surface and a second surface opposed along the vertical direction and extending in a horizontal plane, orthogonal to the vertical direction, the first and second wafers being bonded with the interposition of a dielectric layer arranged above the first surface of the Hall-sensor layer, wherein the vertical Hall element comprises:
at least a first Hall terminal, being a first doped region arranged at the first surface of the Hall-sensor layer;
at least a second Hall terminal, being a second doped region arranged at the second surface of the Hall-sensor layer aligned to the first doped region along the vertical direction and separated therefrom by the thickness of the Hall-sensor layer;
a deep trench isolation ring extending through the Hall-sensor layer from the first surface to the second surface and enclosing and isolating a Hall sensor region of the Hall-sensor layer, wherein the first and second Hall terminals are arranged; and
a first and a second conductive structure coupled to the first, respectively, the second Hall terminal and configured to be electrically connected to respective contact pads embedded in the stack of the second wafer, wherein the vertical Hall element further comprises through silicon vias extending through the Hall-sensor layer, configured to electrically connect the first and a second conductive structures to the contact pads embedded in the stack of the second wafer.

2. The circuit according to claim 1, wherein the Hall-sensor layer is an epitaxial silicon layer and the first and second Hall terminals are doped regions in the Hall-sensor layer, having a same type of conductivity as the Hall-sensor layer.

3. The circuit according to claim 1, wherein the vertical Hall element further comprises:
at least a third Hall terminal, being a third doped region arranged at the first surface of the Hall-sensor layer;
at least a fourth Hall terminal, being a fourth doped region arranged at the second surface of the Hall-sensor layer aligned to the third doped region along the vertical direction and separated therefrom by the thickness of the Hall-sensor layer;
a third and a fourth conductive structure coupled to the third, respectively, the fourth Hall terminal and configured to electrically connect the third, respectively, the fourth Hall terminal to respective contact pads embedded in the stack of the second wafer.

4. The circuit according to claim 3, wherein the first and second Hall terminals and the third and fourth Hall terminals are arranged at a same lateral distance from the deep trench isolation ring.

5. The circuit according to claim 1, further comprising a first dielectric layer on the first surface and a second dielectric layer on the second surface; wherein:
the first conductive structure comprises a metal filling of an opening through the first dielectric layer in contact with the first doped region of the first terminal and a first metal wire arranged on the first oxide layer, which is in contact with said metal filling and has a lateral extension externally to the deep trench isolation ring; a first through silicon via electrically connecting the first metal wire of the first conductive structure and a conductive bridge formed on the second dielectric layer above the second surface, and a second through silicon via electrically connecting the conductive bridge to a first contact pad of the contact pads embedded in the stack of the second wafer; and
the second conductive structure comprises a respective metal filling of an opening through the second dielectric layer in contact with the second doped region of the second terminal and a second metal wire arranged on the second oxide layer, which is in contact with said metal filling and has a lateral extension externally to the deep trench isolation ring; a third through silicon via electrically connecting the second metal wire of the second conductive structure to a second contact pad of the contact pads embedded in the stack of the second wafer.

6. The circuit according to claim 1, wherein part of the processing circuit is integrated in a portion of the Hall-sensor layer of the first wafer.

7. A method of manufacturing of a Hall integrated circuit including a vertical Hall element, comprising forming a stack in a vertical direction of:
a first wafer including a Hall-sensor layer having a first surface and a second surface opposed along the vertical direction and extending in a horizontal plane, orthogonal to the vertical direction; and
a second wafer including a CMOS substrate integrating a CMOS processing circuit configured to be coupled to the vertical Hall element and a stack of dielectric layers arranged on the CMOS substrate, wherein the first and second wafers are bonded with the interposition of a dielectric layer arranged above the first surface of the Hall-sensor layer, and wherein the vertical Hall element comprises:
at least a first Hall terminal, being a first doped region arranged at the first surface of the Hall-sensor layer;
at least a second Hall terminal, being a second doped region arranged at the second surface of the Hall-sensor layer aligned to the first doped region along the vertical direction and separated therefrom by the thickness of the Hall-sensor layer;
a deep trench isolation ring extending through the Hall-sensor layer from the first surface to the second surface and enclosing and isolating a Hall sensor region of the Hall-sensor layer, wherein the first and second Hall terminals are arranged; and
a first and a second conductive structures coupled to the first, respectively, the second Hall terminal and configured to be electrically connected to respective contact pads embedded in the stack of the second wafer, wherein the method of manufacturing further comprises:
forming through silicon vias of the Hall element extending through the Hall-sensor layer, configured to electrically connect the first and a second conductive structures to the contact pads embedded in the stack of the second wafer.

8. The method according to claim 7, wherein forming the stack comprises:
providing the first wafer comprising a substrate and an epitaxial layer formed on the substrate, the epitaxial layer defining the first surface and the substrate having a rear surface opposite the first surface along the vertical direction;
forming the first doped region of the first Hall terminal at the first surface;
forming the first conductive structure coupled to the first Hall terminal and the dielectric layer above the first conductive structure, having a top surface;
flipping the first wafer and bonding the top surface of the dielectric layer to a respective top surface of the stack of the second wafer;
thinning the first wafer from the rear surface, thereby removing the substrate and defining the Hall-sensor layer from the epitaxial layer and the second surface thereof;
forming the second doped region of the second Hall terminal at the second surface;
forming the deep trench isolation ring extending through the Hall-sensor layer from the second surface to the first surface and enclosing and isolating the Hall sensor region of the Hall-sensor layer, wherein the first and second Hall terminals are arranged; and
forming the second conductive structure coupled to the second Hall terminal.

9. The method according to claim 7, wherein forming the first conductive structure comprises forming a first metal wire arranged on a first dielectric layer on the first surface, the first metal wire being in contact with said first terminal via a metal filling of an opening through the first dielectric layer and having a lateral extension externally to the deep trench isolation ring; and wherein forming through silicon vias is performed before forming the second conductive structure and comprises:
forming a first through silicon via electrically connected to the first metal wire of the first conductive structure and a second through silicon via electrically connected to a first contact pad of the contact pads embedded in the stack of the second wafer; and
forming a third through silicon via electrically connected to a second contact pad of the contact pads embedded in the stack of the second wafer; and
wherein forming the second conductive structure comprises forming a second metal wire arranged on a second dielectric layer on the second surface, the second metal wire being in contact with the second terminal via a metal filling of an opening through the second dielectric layer and having a lateral extension externally to the deep trench isolation ring up to the third through silicon via,
further comprising forming a conductive bridge electrically contacting the first and second through silicon vias.

10. The method according to claim 7, wherein the Hall-sensor layer-is an epitaxial silicon layer and the first and second Hall terminals are doped regions in the Hall-sensor layer having a same type of conductivity as the Hall-sensor layer.

11. The method according to claim 7, wherein the vertical Hall element-further comprises:
forming at least a third Hall terminal, being a third doped region arranged at the first surface of the Hall-sensor layer;
forming at least a fourth Hall terminal, being a fourth doped region arranged at the second surface of the Hall-sensor layer aligned to the third doped region along the vertical direction and separated therefrom by the thickness of the Hall-sensor layer;
forming a third and a fourth conductive structures coupled to the third, respectively, the fourth Hall terminals and configured to electrically connect the third, respectively, the fourth Hall terminal to respective contact pads embedded in the stack of the second wafer.

12. The method according to claim 11, wherein the first and second Hall terminals and the third and fourth Hall terminals are formed with corresponding manufacturing steps and are arranged at a same lateral distance from the deep trench isolation ring.

13. The method according to claim 7, further comprising integrating part of the processing circuit in a portion of the Hall-sensor layer of the first wafer.

* * * * *